United States Patent
Yamazaki

(10) Patent No.: US 8,628,987 B2
(45) Date of Patent: Jan. 14, 2014

(54) MANUFACTURING METHODS OF THIN FILM TRANSISTOR, LIQUID CRYSTAL DISPLAY DEVICE, AND SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 140 days.

(21) Appl. No.: 13/216,501

(22) Filed: Aug. 24, 2011

(65) Prior Publication Data

US 2012/0052625 A1 Mar. 1, 2012

(30) Foreign Application Priority Data

Aug. 27, 2010 (JP) ................................. 2010-190856

(51) Int. Cl.
*H01L 21/00* (2006.01)

(52) U.S. Cl.
USPC .................................... 438/30; 257/E21.414

(58) Field of Classification Search
USPC ............................ 438/104, 30; 257/E21.414
See application file for complete search history.

(56) References Cited

U.S. PATENT DOCUMENTS

| | | | |
|---|---|---|---|
| 5,477,355 A | 12/1995 | Sasaki et al. | |
| 5,731,856 A | 3/1998 | Kim et al. | |
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,900,854 B1 * | 5/2005 | Kim et al. | 349/43 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — William D Coleman
*Assistant Examiner* — Christine Enad
(74) *Attorney, Agent, or Firm* — Fish & Richardson P.C.

(57) ABSTRACT

A liquid crystal display device is provided with high productivity at low cost by reducing manufacturing steps of the liquid crystal display device. A liquid crystal display device with less power consumption and high reliability is provided. Etching of a semiconductor layer and formation of a contact hole that connects a pixel electrode and a drain electrode are performed by one photolithography process and one etching step, whereby the number of photolithography processes is reduced. A liquid crystal display device can be provided with high productivity at low cost by reducing the number of photolithography processes. Further, an oxide semiconductor is used for the semiconductor layer, whereby a liquid crystal display device with less power consumption and high reliability can be provided.

31 Claims, 14 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140250 A1* | 6/2009 | Yamazaki et al. .............. 257/57 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0290083 A1* | 11/2009 | Lim et al. ........................ 349/46 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117075 A1* | 5/2010 | Akimoto et al. ................ 257/43 |
| 2010/0163865 A1 | 7/2010 | Arai |
| 2010/0320458 A1 | 12/2010 | Umeda et al. |
| 2010/0320459 A1 | 12/2010 | Umeda et al. |
| 2011/0084265 A1 | 4/2011 | Arasawa et al. |
| 2011/0085104 A1 | 4/2011 | Arasawa et al. |
| 2011/0193083 A1 | 8/2011 | Kim et al. |
| 2011/0215328 A1 | 9/2011 | Morosawa et al. |
| 2012/0052606 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |
| 2012/0119205 A1 | 5/2012 | Taniguchi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05203987 A | 8/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 A | 6/2003 |
| JP | 2004-103957 A | 4/2004 |
| JP | 2004-273614 A | 9/2004 |
| JP | 2004-273732 A | 9/2004 |
| JP | 2009231613 A | 10/2009 |
| JP | 2010016347 A | 1/2010 |
| JP | 04415062 B1 | 2/2010 |
| JP | 2010067954 A | 3/2010 |
| JP | 2010177431 A | 8/2010 |
| JP | 04571221 B1 | 10/2010 |
| JP | 2012160679 A | 8/2012 |
| WO | 2004/114391 A1 | 12/2004 |
| WO | 2008133345 A1 | 11/2008 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04. : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa,Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98. pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al.. "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTS With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys.Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier transport properties and electronic structures of amorphous oxide semiconductors: the present status"; Solid State Physics; Sep. 1, 2009; pp. 621-633; vol. 44, No. 9; Agne Gijutsu Center.

Kamiya, T et al., "Carrier Transport Properties and Electronic Structures of Amorphous Oxide Semiconductors: The present status," Solid State Physics, Agne Gijutsu Center, Sep. 1, 2009, vol. 44, No. 9, pp. 621-633 with English translation.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008, with Full Translation.

\* cited by examiner

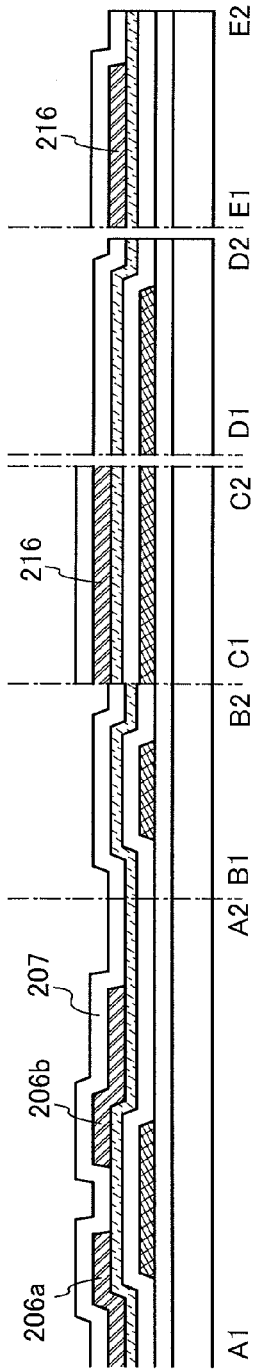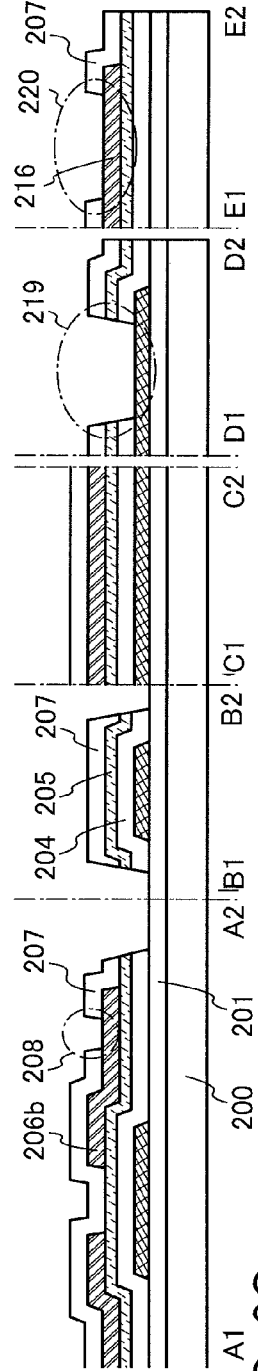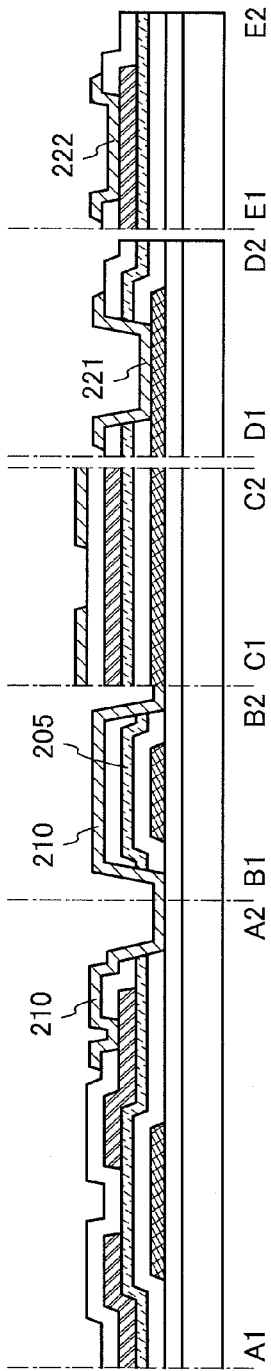

● In
○ Sn
○ Zn
● O

● In
○ Ga
○ Zn
● O

MANUFACTURING METHODS OF THIN FILM TRANSISTOR, LIQUID CRYSTAL DISPLAY DEVICE, AND SEMICONDUCTOR DEVICE

BACKGROUND OF THE INVENTION

1. Field of the Invention

The present invention relates to manufacturing methods of a thin film transistor, a liquid crystal display device, and a semiconductor device.

In this specification, a semiconductor device means all types of devices which can function by utilizing semiconductor characteristics, and a semiconductor circuit, a memory device, an imaging device, a display device, an electro-optical device, an electronic device, and the like are all semiconductor devices.

2. Description of the Related Art

In recent years, thin film transistors that are formed using a semiconductor thin film having a thickness of several nanometers to several hundreds of nanometers over a substrate having an insulating surface such as a glass substrate have been attracting attentions. Thin film transistors are widely used for electronic devices such as integrated circuits (ICs) and electro-optical devices. In particular, thin film transistors are urgently developed as switching elements of image display devices typified by liquid crystal display devices, and the like. In an active matrix liquid crystal display device, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation is recognized as a display pattern by an observer. An active matrix liquid crystal display device here means a liquid crystal display device which employs a method in which a display pattern is formed on a screen by driving pixel electrodes arranged in matrix using switching elements.

The application range of the active matrix liquid crystal display devices is expanding, and demands for larger screen size, higher definition, and higher aperture ratio are increasing. In addition, it is demanded that the active matrix liquid crystal display devices have high reliability and that a production method of the active matrix liquid crystal display devices offers high yield and reduction in production cost. As a method for increasing yield and reducing production cost, simplification of the process is given.

In active matrix liquid crystal display devices, thin film transistors are mainly used as switching elements. In manufacturing thin film transistors, reduction in the number of photolithography processes or simplification of a photolithography process are important for simplification of the whole process. For example, if one photolithography process is added, the following steps are further needed: resist application, prebaking, light exposure, development, postbaking, and the like. In addition, steps before and after the aforementioned steps such as film formation, etching, resist removal, cleaning, and drying are needed. The number of steps is significantly increased only by adding one photolithography process in the manufacturing process. Therefore, many techniques for reducing the number of photolithography processes or simplification of a photolithography process in a manufacturing process have been developed.

Thin film transistors are broadly classified into top gate thin film transistors in each of which a channel formation region is provided below a gate electrode and bottom gate thin film transistors in each of which a channel formation region is provided above a gate electrode. In general, at least five photomasks are needed for manufacturing such a thin film transistor.

Many conventional techniques for simplification of a photolithography process use a complicated technique such as backside light exposure, resist reflow, or a lift-off method, which requires a special apparatus. There is a possibility that the yield is decreased due to various problems caused by usage of such a complicated technique. Moreover, in many cases, electric characteristics of thin film transistors are sacrificed due to the priority of the simplification.

As typical means for simplification of a photolithography process in a manufacturing process of a thin film transistor, a technique using a multi-tone mask (called a half-tone mask or a gray-tone mask) is widely known. As a technique for reducing the number of manufacturing steps by using a multi-tone mask, Patent Document 1 is disclosed, for example.

REFERENCE

Patent Document

[Patent Document 1] Japanese Published Patent Application No. 2003-179069

SUMMARY OF THE INVENTION

An object of one embodiment of the present invention is to reduce the number of photolithography processes used for manufacturing a thin film transistor, as compared with the conventional manufacturing method.

An object of one embodiment of the present invention is to perform patterning of a liquid crystal display device including a thin film transistor without an additional photomask.

An object of one embodiment of the present invention is to reduce the number of photomasks used for manufacturing a display device including a thin film transistor, as compared with the conventional manufacturing method.

An object of one embodiment of the present invention is to provide a liquid crystal display device with less power consumption.

An object of one embodiment of the present invention is to provide a liquid crystal display device with high reliability.

Through one photolithography process, etching of a semiconductor layer and formation of a contact hole are performed. Specifically, a photolithography process for forming an island-shaped semiconductor layer is performed simultaneously with a photolithography process for forming a contact hole that contacts a pixel electrode and a drain electrode.

According to one embodiment of the present invention, a gate electrode is formed over a substrate through a first photolithography process; a gate insulating layer is over the gate electrode; a semiconductor layer is over the gate insulating layer; a source electrode and a drain electrode are formed over the semiconductor layer through a second photolithography process; an insulating layer is formed over the source electrode and the drain electrode; through a third photolithography process, part of the insulating layer overlapping with the drain electrode is selectively removed to form a contact hole and part of the insulating layer, part of the semiconductor layer, and part of the gate insulating layer which overlaps with neither the source electrode nor the drain electrode are removed; and a pixel electrode is formed over the insulating layer through a fourth photolithography process.

An insulating layer having a function of preventing diffusion of an impurity element from the substrate may be provided between the substrate and the gate electrode.

In one embodiment of the present invention, a first insulating layer is formed over a substrate; a first electrode is formed over the first insulating layer; a second insulating layer is formed over the first electrode; a semiconductor layer is formed over the second insulating layer; a second electrode and a third electrode are formed over the semiconductor layer; a third insulating layer is formed to cover the second electrode and the third electrode; removal of part of the third insulating layer overlapping with the second electrode or the third electrode so as to form a contact hole and removing of part of the third insulating layer, part of the semiconductor layer, and part of the second insulating layer are performed through one process.

The second insulating layer functions as a gate insulating layer and the third insulating layer functions as a protective insulating layer. The first electrode functions as a gate electrode, the second electrode functions as one of a source electrode and a drain electrode, and the third electrode functions as the other of the source electrode and the drain electrode.

The formation of a contact hole and removal of part of the third insulating layer, part of the semiconductor layer, and part of the second insulating layer can be performed by either dry etching or wet etching, or both dry etching and wet etching.

The gate electrode, the source electrode, the drain electrode, or a wiring connected to such an electrode is formed using a material containing copper or aluminum, whereby the wiring resistance can be reduced and thus signal delay can be prevented.

Further, an oxide semiconductor is used for the semiconductor layer, whereby a liquid crystal display device with less power consumption and high reliability can be realized.

Note that oxygen is supplied to a highly purified oxide semiconductor (a purified OS) that is obtained by reducing an impurity serving as an electron donor (donor), such as moisture or hydrogen, so that the oxygen deficiency in the oxide semiconductor is reduced; thus, an i-type (intrinsic) oxide semiconductor or a substantially i-type oxide semiconductor can be fainted. A transistor including an i-type or a substantially i-type oxide semiconductor has a characteristic of an extremely low off-state current. Specifically, the hydrogen concentration of the highly-purified oxide semiconductor which is measured by secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$.

The carrier density of an i-type or substantially i-type oxide semiconductor, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. With use of an i-type or substantially i-type oxide semiconductor, off-state current of a transistor can be reduced.

The SIMS analysis of the hydrogen concentration in the oxide semiconductor is described here. Because of the principle of the SIMS analysis, it is known to be difficult to obtain accurate data in the proximity of a surface of a sample or in the proximity of an interface between stacked films formed of different materials. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In that case, the maximum value or the minimum value of the hydrogen concentration in a region where the film is provided is employed as the hydrogen concentration of the film. Furthermore, in the case where a mountain-shaped peak having the maximum value and a valley-shaped peak having the minimum value do not exist in the region where the film is provided, the value of the inflection point is employed as the hydrogen concentration.

According to one embodiment of the present invention, manufacturing steps of a liquid crystal display device can be significantly reduced, whereby a liquid crystal display device can be provided with high productivity at low cost.

A liquid crystal display device with less power consumption and high reliability can be provided.

BRIEF DESCRIPTION OF THE DRAWINGS

In the accompanying drawings:

FIGS. 6A to 6C are cross-sectional process views illustrating the one embodiment of the present invention;

DETAILED DESCRIPTION OF THE INVENTION

Figure 1A:
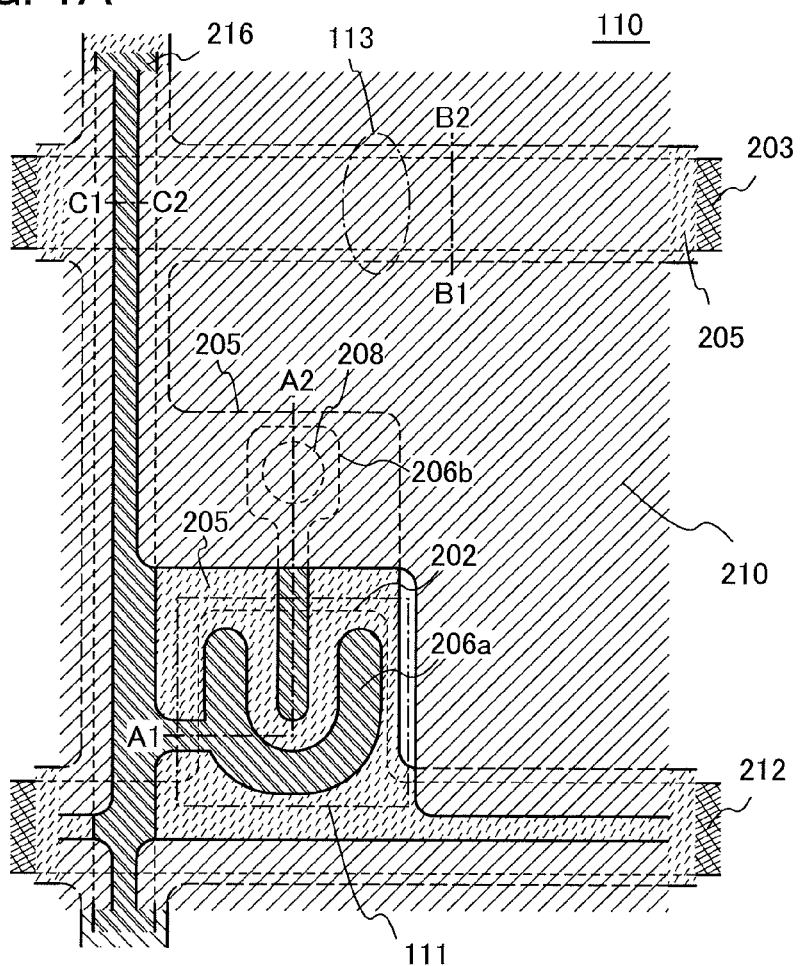
FIGS. 1A and 1B are a top view and a cross-sectional view illustrating one embodiment of the present invention.

Embodiments will be described in detail with reference to the drawings. Note that the present invention is not limited to the following description, and it is easily understood by those skilled in the art that modes and details of the present invention can be modified in a variety of ways without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

A transistor is a kind of semiconductor elements and can achieve amplification of a current or a voltage, switching operation for controlling conduction or non-conduction, and the like. A transistor in this specification includes an insulated-gate field effect transistor (IGFET) and a thin film transistor (TFT).

Functions of a "source" and a "drain" of a transistor are sometimes replaced with each other when a transistor of opposite polarity is used or when the direction of current flowing is changed in circuit operation, for example. Therefore, the teens "source" and "drain" can be used to denote the drain and the source, respectively, in this specification.

In addition, in this specification and the like, the term "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.
(Embodiment 1)

In this embodiment, as examples, pixel structures and a manufacturing method of liquid crystal display devices for which a reduced number of photomasks and a reduced number of photolithography processes are reduced are described with reference to FIGS. 1A and 1B, FIGS. 2A and 2B, FIGS. 3A and 3B, FIGS. 4A-1, 4A-2, 4B-1, and 4B-2, FIGS. 5A to 5C, and FIGS. 6A to 6C.

Figure 3A:
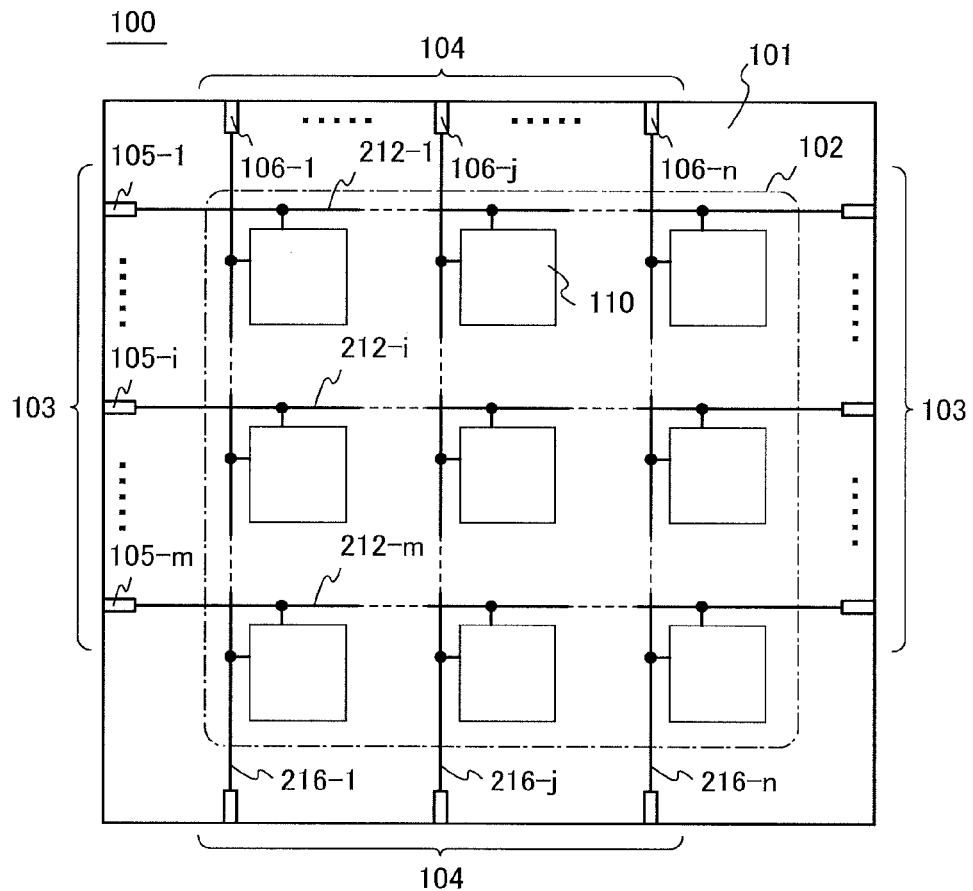
FIGS. 3A and 3B are circuit diagrams illustrating one embodiment of the present invention.

FIG. 3A shows a structure example of a semiconductor device 100 used in a liquid crystal display device. The semiconductor device 100 includes, over a substrate 101, a pixel region 102, a terminal portion 103 including in (m is an integer greater than or equal to 1) terminals 105, and a terminal portion 104 including n (n is an integer greater than or equal to 1) terminals 106. The semiconductor device 100 also includes m wirings 212 electrically connected to the terminal portion 103, and n wirings 216 electrically connected to the terminal portion 104. The pixel region 102 includes a plurality of pixels 110 arranged in matrix of m rows (in the longitudinal direction)×n columns (in the transverse direction). The pixel 110 in the i-th row and the j-th column (i, j) (i is an integer greater than or equal to 1 and less than or equal to m, and j is an integer greater than or equal to 1 and less than or equal to n) is electrically connected to a wiring 212-$i$ and a wiring 216-$j$. The wiring 212-$i$ is electrically connected to a terminal 105-$i$, and the wiring 216-$j$ is electrically connected to a terminal 106-$j$.

The terminal portion 103 and the terminal portion 104 are external input terminals, and connected to a control circuit provided externally, through a flexible printed circuit (FPC) or the like. Signals supplied from the control circuit provided externally are input to the semiconductor device 100 through the terminal portions 103 and the terminal portions 104. In FIG. 3A, the terminal portions 103 are provided on the right external side and the left external side of the pixel region 102, and signals are input from the two portions. Further, the terminal portions 104 are provided on the upper external side and the lower external side of the pixel region 102, and signals are input from the two portions. The signal supply capability is increased by the input of signals from the two portions; thus, high-speed operation of the semiconductor device 100 can be easily achieved. Moreover, the influence of signal delay due to increase in wiring resistance, which is caused by increase in size or improvement in definition of the semiconductor device 100, can be reduced. Further, the semiconductor device 100 can have redundancy, so that the reliability of the semiconductor device 100 can be increased. Note that although FIG. 3A shows the structure in which two terminal portions 103 and two terminal portions 104 are provided, a structure may be employed in which one terminal portion 103 and one terminal portion 104 are provided.

Figure 3B:
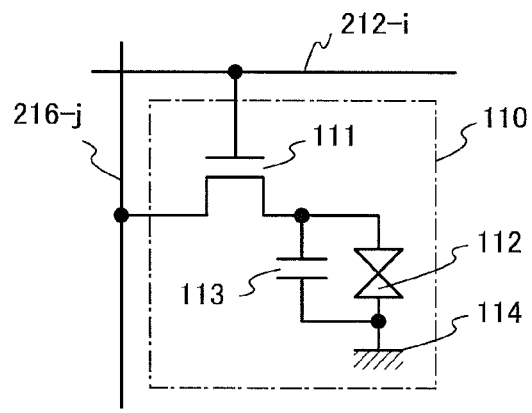

FIG. 3B shows a circuit configuration of the pixel 110. The pixel 110 includes a transistor 111, a liquid crystal element 112, and a capacitor 113. A gate electrode of the transistor 111 is electrically connected to the wiring 212-$i$, and one of a source electrode and a drain electrode of the transistor 111 is electrically connected to the wiring 216-$j$. The other of the source electrode and the drain electrode of the transistor 111 is electrically connected to one electrode of the liquid crystal element 112 and one electrode of the capacitor 113. The other electrode of the liquid crystal element 112 and the other electrode of the capacitor 113 are electrically connected to an electrode 114. The potential of the electrode 114 may be a fixed potential, e.g., 0V, GND, or a common potential.

The transistor 111 has a function of determining whether an image signal supplied from the wiring 216 is input to the liquid crystal element 112 or not. When a signal for turning on the transistor 111 is supplied to the wiring 212-$i$, an image signal from the wiring 216-$j$ is supplied to the liquid crystal element 112 through the transistor 111. The light transmittance of the liquid crystal element 112 is controlled depending on the supplied image signal (potential). The capacitor 113 serves as a storage capacitor (also referred to as a Cs capacitor) for keeping the potential supplied to the liquid crystal element 112. Although the capacitor 113 is not necessarily provided, when the capacitor 113 is provided, variation in the potential applied to the liquid crystal element 112, which is caused by current (off-state current) flowing between the source electrode and the drain electrode during an off state of the transistor 111, can be suppressed.

A single crystal semiconductor, a polycrystalline semiconductor, a microcrystalline semiconductor, an amorphous semiconductor, or the like can be used as a semiconductor for forming a channel of the transistor 111. Examples of a semiconductor material include silicon, germanium, silicon germanium, silicon carbide, and gallium arsenide.

Alternatively, an oxide semiconductor can be used as a semiconductor for forming the channel of the transistor 111. An oxide semiconductor has a wide energy gap of 3.0 eV or more. In a transistor obtained by processing an oxide semiconductor under appropriate conditions, off-state current can be 100 zA ($1\times10^{-19}$ A) or lower, further, 10 zA ($1\times10^{-20}$ A) or lower, furthermore, 1 zA ($1\times10^{-21}$ A) or lower at an operating temperature (e.g., at 25° C.). Thus, the potential applied to the liquid crystal element 112 can be kept without the capacitor 113. In addition, a liquid crystal display device with less power consumption can be achieved.

Figure 1B:
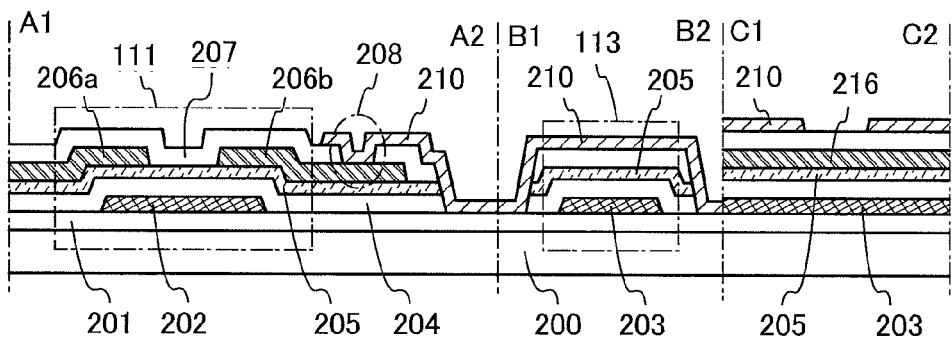

Next, a structure example of the pixel 110 illustrated in FIGS. 3A and 3B is described with reference to FIGS. 1A and 1B. FIG. 1A is a top view illustrating a plan structure of the pixel 110, and FIG. 1B is a cross-sectional view illustrating a stacked structure of the pixel 110. Note that chain lines A1-A2, B1-B2, and C1-C2 in FIG. 1A correspond to cross sections A1-A2, B1-B2, and C1-C2 in FIG. 1B, respectively.

In the transistor 111 described in this embodiment, a drain electrode 206$b$ is partly surrounded by a U-shaped (C-shaped, reversed C-shaped, or horseshoe-shaped) source electrode 206$a$. With the source electrode having such a shape, an enough channel width can be secured even when the area of a transistor is small; thus, the amount of current flowing during a conduction state of the transistor (also referred to as an on-state current) can be increased.

When the parasitic capacitance between a gate electrode 202 and the drain electrode 206$b$ electrically connected to a pixel electrode 210 is large, the transistor is easily influenced by feedthrough; therefore, the potential supplied to the liquid crystal element 112 cannot be kept accurately, which may deteriorate the display quality. As described in this embodiment, with the structure in which the drain electrode 206b is partly surrounded by the U-shaped source electrode 206a, an enough channel width can be secured and the parasitic capacitance between the drain electrode 206b and the gate electrode 202 can be small; whereby the display quality of the liquid crystal display device can be improved.

In the cross section A1-A2, a stacked structure of the transistor 111 is illustrated. The transistor 111 is a bottom-gate transistor. In the cross section B1-B2, a stacked structure of the capacitor 113 is illustrated. Further, in the cross section C1-C2, a stacked structure in a wiring intersection portion of a capacitor wiring 203 and the wiring 216 is illustrated.

In the cross section A1-A2, a base layer 201 is formed over a substrate 200, and a gate electrode 202 is formed over the base layer 201. Over the gate electrode 202, a gate insulating layer 204 and a semiconductor layer 205 are formed. Further, the source electrode 206a and the drain electrode 206b are formed over the semiconductor layer 205. Over the source electrode 206a and the drain electrode 206b, an insulating layer 207 is formed in contact with part of the semiconductor layer 205. The pixel electrode 210 is formed over the insulating layer 207, and electrically connected to the drain electrode 206b through a contact hole 208 formed in the insulating layer 207.

Part of the gate insulating layer 204, part of the semiconductor layer 205, and part of the insulating layer 207 are removed, and the pixel electrode 210 is formed in contact with a side surface of the gate insulating layer 204, a side surface of the semiconductor layer 205, and a side surface of the insulating layer 207. In this embodiment, an i-type (intrinsic) or substantially i-type oxide semiconductor is used for the semiconductor layer 205. An i-type or substantially i-type oxide semiconductor can be substantially regarded as an insulator. Therefore, when the pixel electrode 210 is in contact with an end portion of the semiconductor layer 205, a problem such as leakage current does not occur.

In the cross section B1-B2, the base layer 201 is formed over the substrate 200, and the capacitor wiring 203 is formed over the base layer 201. The gate insulating layer 204 and the semiconductor layer 205 are formed over the capacitor wiring 203, and the insulating layer 207 is formed over the semiconductor layer 205. Further, over the insulating layer 207, the pixel electrode 210 is formed.

A portion where the capacitor wiring 203 and the pixel electrode 210 overlap with each other with the gate insulating layer 204, the semiconductor layer 205, and the insulating layer 207 interposed therebetween functions as the capacitor 113. The gate insulating layer 204, the semiconductor layer 205, and the insulating layer 207 function as a dielectric layer. Since the dielectric layer formed between the capacitor wiring 203 and the pixel electrode 210 have a multi-layer structure, even when a pinhole is formed in one layer in the dielectric layer, the pinhole is covered with another layer in the dielectric layer; thus, the capacitor 113 can function normally. Further, the relative dielectric constant of an oxide semiconductor is 14 to 16, which is high; thus, the capacitance of the capacitor 113 can be large by using an oxide semiconductor for the semiconductor layer 205.

In the cross section C1-C2, the base layer 201 is formed over the substrate 200, and the capacitor wiring 203 is formed over the base layer 201. Further, the gate insulating layer 204 and the semiconductor layer 205 are formed over the capacitor wiring 203. Furthermore, the wiring 216 is formed over the semiconductor layer 205, and the insulating layer 207 and the pixel electrode 210 are formed over the wiring 216.

Figure 2A:
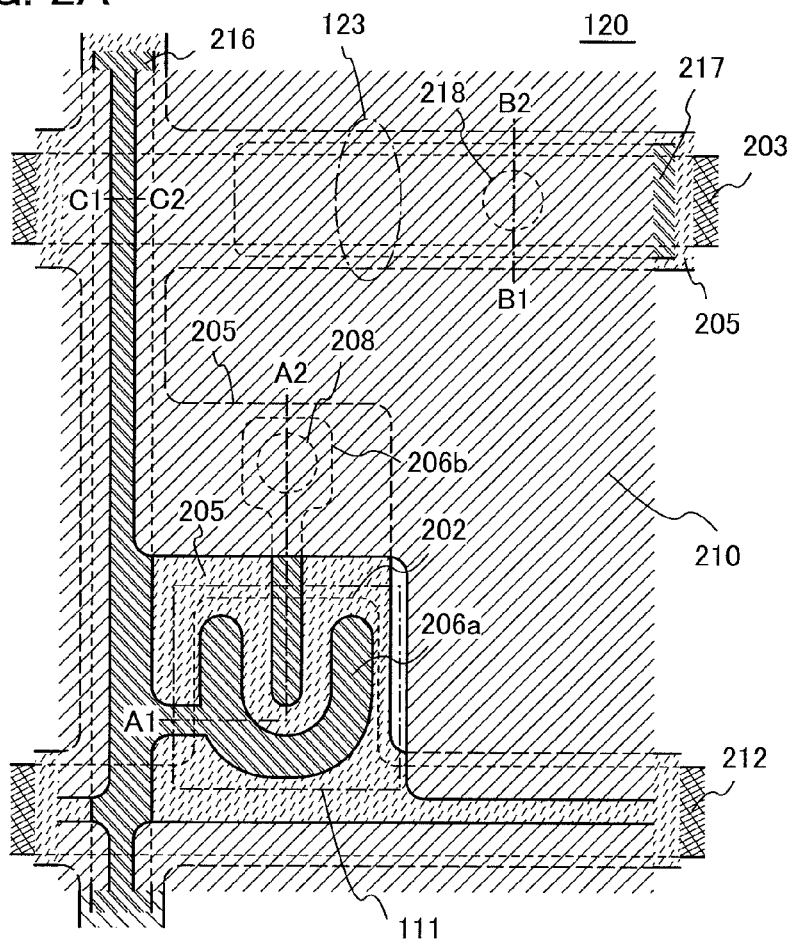
FIGS. 2A and 2B are a top view and a cross-sectional view illustrating one embodiment of the present invention.
Figure 2B:
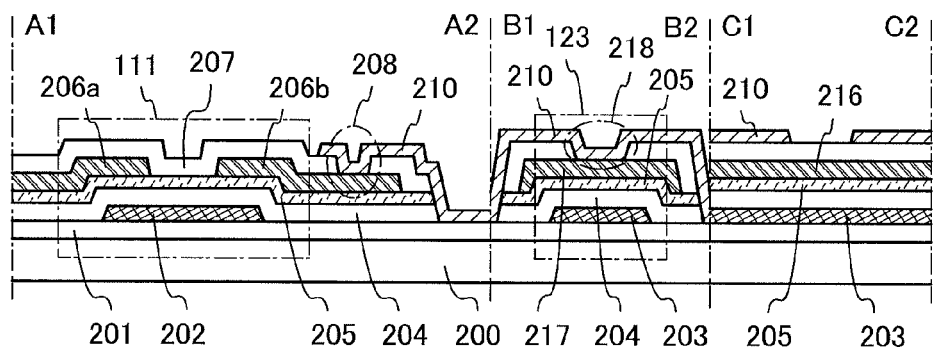

Next, a structure example that is different from the pixel structure illustrated in FIGS. 1A and 1B is described with reference to FIGS. 2A and 2B. FIG. 2A is a top view illustrating a plan structure of a pixel 120, and FIG. 2B is a cross-sectional view illustrating a stacked structure of the pixel 120. Note that chain lines A1-A2, B1-B2, and C1-C2 in FIG. 2A correspond to cross sections A1-A2, B1-B2, and C1-C2 in FIG. 2B, respectively. The capacitor of the pixel 120 is different from that in the pixel 110 illustrated in FIGS. 1A and 1B.

In the cross section B1-B2, the base layer 201 is formed over the substrate 200, and the capacitor wiring 203 is formed over the base layer 201. The gate insulating layer 204 and the semiconductor layer 205 are formed over the capacitor wiring 203, and an electrode 217 is formed over the semiconductor layer 205. Further, the insulating layer 207 is formed over the electrode 217, and the pixel electrode 210 is formed over the insulating layer 207. The pixel electrode 210 is electrically connected to the electrode 217 through a contact hole 218 formed in the insulating layer 207.

A portion where the capacitor wiring 203 and the electrode 217 overlap with each other with the gate insulating layer 204 and the semiconductor layer 205 interposed therebetween functions as a capacitor 123. The thickness of a dielectric layer, which is formed between the capacitor wiring 203 and the electrode 217, in the capacitor 123 can be smaller than that in the capacitor 113 by the thickness of the insulating layer 207. Thus, the capacitance of the capacitor 123 can be larger than that of the capacitor 113.

Figures 1, 4A:
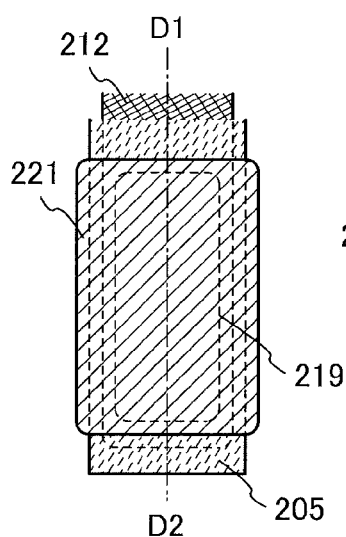
FIGS. 4A-1 and 4B-1 are top views illustrating embodiments of the present invention and FIGS. 4A-2 and 4B-2 are cross-sectional views illustrating the embodiments of the present invention.
Figures 2, 4A:
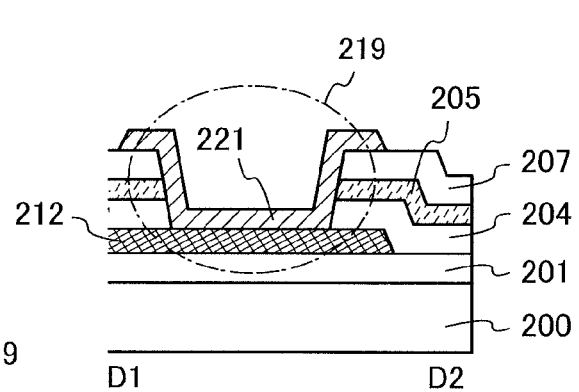
Figures 1, 4B:
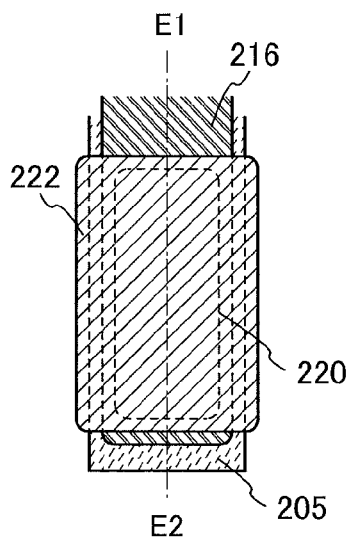
Figures 2, 4B:
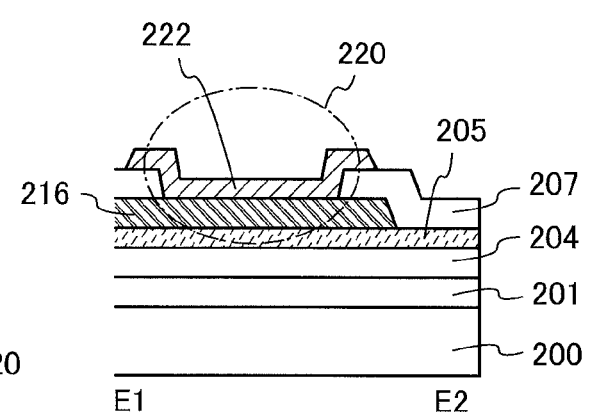
Figure 5A:
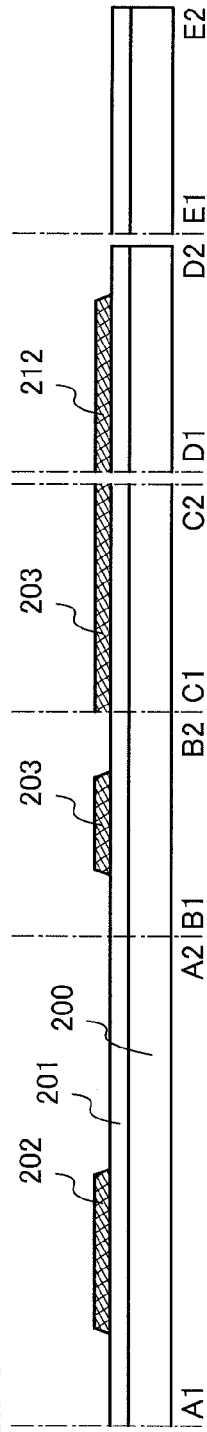
FIGS. 5A to 5C are cross-sectional process views illustrating one embodiment of the present invention.
Figure 5B:
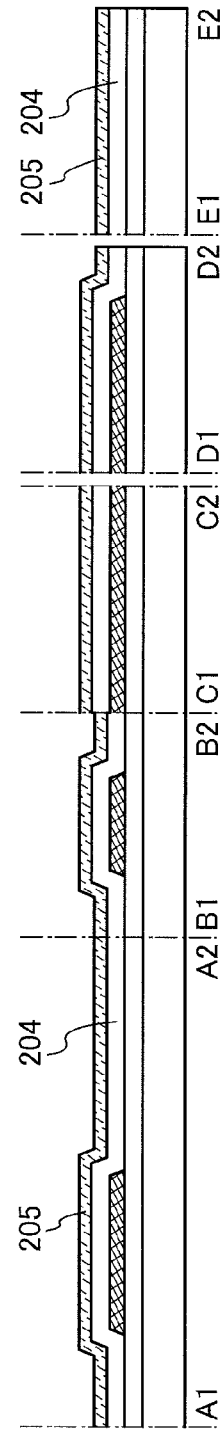
Figure 5C:
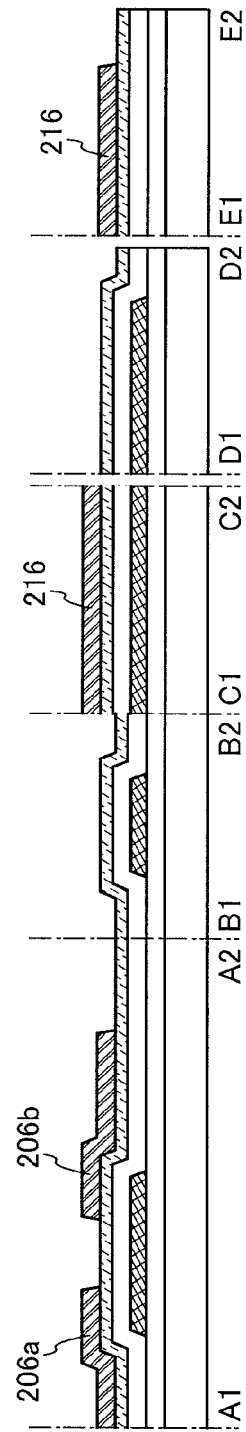

Next, structure examples of the terminal 105 and the terminal 106 are described with reference to FIGS. 4A-1, 4A-2, 4B-1, and 4B-2. FIGS. 4A-1 and 4A-2 are a top view and a cross-sectional view illustrating the terminal 105, respectively. A chain line D1-D2 in FIG. 4A-1 corresponds to a cross section D1-D2 in FIG. 4A-2. FIGS. 4B-1 and 4B-2 are a top view and a cross-sectional view illustrating the terminal 106, respectively. A chain line E1-E2 in FIG. 4B-1 corresponds to a cross section E1-E2 in FIG. 4B-2.

In the cross section D1-D2, the base layer 201 is formed over the substrate 200, and the wiring 212 is formed over the base layer 201. The gate insulating layer 204, the semiconductor layer 205, and the insulating layer 207 are formed over the wiring 212. An electrode 221 is formed over the insulating layer 207 and electrically connected to the wiring 212 through a contact hole 219 formed in the gate insulating layer 204, the semiconductor layer 205, and the insulating layer 207.

In the cross section E1-E2, the base layer 201, the gate insulating layer 204, and the semiconductor layer 205 are formed over the substrate 200. The wiring 216 is formed over the semiconductor layer 205, and the insulating layer 207 is formed over the wiring 216. An electrode 222 is formed over the insulating layer 207, and electrically connected to the wiring 216 through a contact hole 220 formed in the insulating layer 207.

Next, a manufacturing method of a pixel portion in the liquid crystal display device described using FIGS. 1A and 1B is described with reference to FIGS. 5A to 5C and FIGS. 6A to 6C. Note that cross sections A1-A2, B1-B2, and C1-C2 in FIGS. 5A to 5C and FIGS. 6A to 6C are cross-sectional views taken along the chain lines A1-A2, B1-B2, and C1-C2 in FIG. 1A, respectively.

Note that in FIGS. 5A to 5C and FIGS. 6A to 6C, a cross section D1-D2 showing a stacked structure of the terminal 105 and a cross section E1-E2 showing a stacked structure of the terminal 106 are additionally illustrated. In the cross sections D1-D2 and E1-E2, each of D2 and E2 corresponds to an edge of the substrate.

First, over the substrate 200, an insulating layer serving as the base layer 201 is formed with a thickness of greater than or equal to 50 nm and less than or equal to 300 nm, preferably greater than or equal to 100 nm and less than or equal to 200 nm. As the substrate 200, in addition to a glass substrate and a ceramic substrate, a plastic substrate or the like with heat resistance to withstand a process temperature in this manufacturing process can be used. In the case where a substrate does not need a light-transmitting property, a metal substrate such as a stainless steel alloy whose surface is provided with an insulating layer may be used. As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm). In this embodiment, aluminoborosilicate glass is used for the substrate 200.

The base layer 201 can be formed with a single-layer structure or a stacked structure using at least one of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of an impurity element from the substrate 200. Note that in this specification, silicon nitride oxide refers to silicon that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The base layer 201 can be formed by a sputtering method, a CVD method, a coating method, a printing method, or the like as appropriate.

In this embodiment, a stack of a silicon nitride layer and a silicon oxide layer is used as the base layer 201. Specifically, a 50-nm-thick silicon nitride layer is formed over the substrate 200, and a 150-nm-thick silicon oxide layer is formed over the silicon nitride layer. Note that the base layer 201 may be doped with phosphorus (P) or boron (B).

When a halogen element such as chlorine or fluorine is contained in the base layer 201, a function of preventing diffusion of an impurity element from the substrate 200 can be further improved. The concentration of a halogen element contained in the base layer 201 is measured by secondary ion mass spectrometry (SIMS) and its peak is preferably greater than or equal to $1\times10^{15}/cm^3$ and less than or equal to $1\times10^{20}/cm^3$.

The base layer 201 may be formed using gallium oxide. Alternatively, the base layer 201 may have a stacked structure of a gallium oxide layer and the above insulating layer. Gallium oxide is a material which is hardly charged; therefore, variation in threshold voltage due to charge buildup of the insulating layer can be suppressed.

Next, over the base layer 201, a conductive layer is formed to have a thickness greater than or equal to 100 nm and less than or equal to 500 nm, preferably greater than or equal to 200 nm and less than or equal to 300 nm, by a sputtering method, a vacuum evaporation method, or a plating method. Then, through a first photolithography process, a resist mask is formed, and the conductive layer is selectively etched, whereby the gate electrode 202, the capacitor wiring 203, and the wiring 212 are formed.

The conductive layer for forming the gate electrode 202, the capacitor wiring 203, and the wiring 212 can be formed to have a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these as its main component.

Since the conductive layer serves as a wiring, a low resistance material such as Al or Cu is preferably used. With use of Al or Cu, signal delay is reduced, so that higher image quality can be expected. Note that Al has low heat resistance, and thus a defect due to hillocks, whiskers, or migration is easily generated. To prevent migration of Al, a layer of a metal material having a higher melting point than Al, such as Mo, Ti, or W, is preferably stacked over an Al layer. In the case where a material containing Al is used for the conductive layer, the maximum process temperature in a later step is preferably set to 380° C. or lower, further preferably 350° C. or lower.

Also in the case where Cu is used for the conductive layer, in order to prevent a defect due to migration and diffusion of a Cu element, a layer of a metal material having a higher melting point than Cu, such as Mo, Ti, or W, is preferably stacked over the conductive layer containing Cu. In the case where a material containing Cu is used for the conductive layer, the maximum process temperature in a later step is preferably set to 450° C. or lower.

In this embodiment, as the conductive layer, a 5-nm-thick Ti layer is formed over the base layer 201, and a 250-nm-thick Cu layer is formed over the Ti layer. After that, through the first photolithography process, the conductive layer is selectively etched, so that the gate electrode 202, the capacitor wiring 203, and the wiring 212 are formed (see FIG. 5A).

Note that a resist mask used in the photolithography process may be formed by an inkjet method. Formation of the resist mask by an inkjet method needs no photomask; thus, manufacturing cost can be reduced. The resist mask is removed after the etching, and description thereof in each photolithography process is omitted.

Then, the gate insulating layer 204 is formed with a thickness of greater than or equal to 50 nm and less than or equal to 800 nm, preferably greater than or equal to 100 nm and less than or equal to 600 nm over the gate electrode 202, the capacitor wiring 203, and the wiring 212. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate ($HfSi_xO_y$ (x>0, y>0)), hafnium silicate to which nitrogen is added, hafnium aluminate to which nitrogen is added, or the like. A plasma CVD method, a sputtering method, or the like can be employed. The gate insulating layer 204 is not limited to a single layer and may be a stack of different layers. For example, the gate insulating layer 204 may be formed in the following manner: a silicon nitride layer ($SiN_y$ (y>0)) is formed by a plasma CVD method as a gate insulating layer A and a silicon oxide layer ($SiO_x$ (x>0)) is stacked over the gate insulating layer A as a gate insulating layer B.

In addition to a sputtering method and a plasma CVD method, the gate insulating layer 204 can be formed by a high-density plasma CVD method using microwaves (e.g., a frequency of 2.45 GHz), for example.

In this embodiment, a stacked layer of silicon nitride and silicon oxide is used as the gate insulating layer 204. Specifically, a 50-nm-thick silicon nitride layer is formed over the gate electrode 202, and a 100-nm-thick silicon oxide layer is formed over the silicon nitride layer.

The gate insulating layer 204 also functions as a protective layer. With the structure in which the gate electrode 202 containing Cu is covered with the insulating layer containing silicon nitride, diffusion of Cu from the gate electrode 202 can be prevented.

In the case where an oxide semiconductor is used for a semiconductor layer that is formed later, the gate insulating layer 204 may be formed using an insulating material containing the same kind of component as the oxide semiconductor. In the case where the gate insulating layer 204 is a stack of different layers, a layer in contact with the oxide semiconductor is formed using an insulating material containing the same kind of component as the oxide semiconductor. Such a material is compatible with the oxide semiconductor, and the use of such a material for the gate insulating layer 204 can keep the interface state between the oxide semiconductor and the gate insulating layer 204 favorable. Here, "the same kind of component as the oxide semiconductor" means one or more elements selected from constituent elements of the oxide semiconductor. For example, in the case where the oxide semiconductor is foamed using an In—Ga—Zn-based oxide semiconductor material, gallium oxide is given as an insulating material containing the same kind of component as the oxide semiconductor.

In the case of employing a stacked structure, the gate insulating layer 204 may have a stacked structure of a film formed using an insulating material containing the same kind of component as the oxide semiconductor and a film containing a material different from the component material of the film.

In order that hydrogen, a hydroxyl group, and moisture are contained as little as possible in the oxide semiconductor layer, it is preferable that the substrate 200 be preheated in a preheating chamber of a sputtering apparatus as pretreatment before formation of the oxide semiconductor layer, so that impurities such as hydrogen or moisture adsorbed onto the substrate 200 or the gate insulating layer 204 are eliminated and removed. As an evacuation unit provided in the preheating chamber, a cryopump is preferable. Note that this preheating treatment can be omitted. Similarly, the substrate 200 over which components up to and including the gate electrode 202, the capacitor wiring 203, and the wiring 212 are formed may be subjected to this preheating treatment before the gate insulating layer 204 is formed.

An oxide semiconductor used for the semiconductor layer 205 preferably contains at least indium (In) or zinc (Zn). In particular, In and Zn are preferably contained. Further, as a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For example, as the oxide semiconductor, an indium oxide, a tin oxide, a zinc oxide, a two-component metal oxide such as an In—Zn-based oxide; a Sn—Zn-based oxide; an Al—Zn-based oxide; a Zn—Mg-based oxide; a Sn—Mg-based oxide; an In—Mg-based oxide; or an In—Ga-based oxide, a three-component metal oxide such as an In—Ga—Zn-based oxide (also referred to as IGZO); an In—Al—Zn-based oxide; an In—Sn—Zn-based oxide; a Sn—Ga—Zn-based oxide; an Al—Ga—Zn-based oxide; a Sn—Al—Zn-based oxide; an In—Hf—Zn-based oxide; an In—La—Zn-based oxide; an In—Ce—Zn-based oxide; an In—Pr—Zn-based oxide; an In—Nd—Zn-based oxide; an In—Sm—Zn-based oxide; an In—Eu—Zn-based oxide; an In—Gd—Zn-based oxide; an In—Tb—Zn-based oxide; an In—Dy—Zn-based oxide; an In—Ho—Zn-based oxide; an In—Er—Zn-based oxide; an In—Tm—Zn-based oxide; an In—Yb—Zn-based oxide; or an In—Lu—Zn-based oxide, or a four-component metal oxide such as an In—Sn—Ga—Zn-based oxide; an In—Hf—Ga—Zn-based oxide; an In—Al—Ga—Zn-based oxide; an In—Sn—Al—Zn-based oxide; an In—Sn—Hf—Zn-based oxide; or an In—Hf—Al—Zn-based oxide can be used.

The oxide semiconductor preferably contains In, and further preferably contains In and Ga. It is effective to perform dehydration or dehydrogenation in a later step in order to increase the purity of the oxide semiconductor layer.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

For the oxide semiconductor layer, a thin film expressed by a chemical formula $InMO_3(ZnO)_m$ (m>0) can be used. Here, M represents one or more metal elements selected from Sn, Zn, Ga, Al, Mn, and Co. For example, M can be Ga, Ga and Al, Ga and Mn, Ga and Co, or the like.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm. Note that $R_a$ can be measured using an atomic force microscope (AFM).

As the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 11A to 11E, FIGS. 12A to 12C, and FIGS. 13A to 13C. In FIGS. 11A to 11E, FIGS. 12A to 12C, and FIGS. 13A to 13C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 11A to 11E, O surrounded by a circle represents tetracoodianate O and O surrounded by a double circle represents tricoodenate O.

Figure 11A:
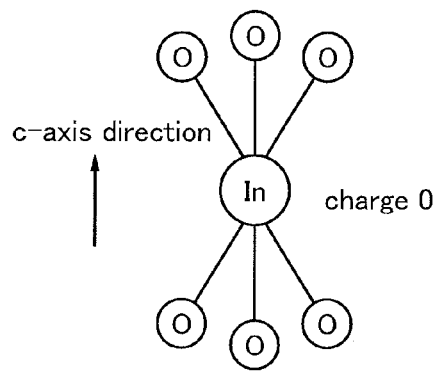
FIGS. 11A to 11E are views each illustrating a crystal structure of an oxide material.

FIG. 11A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 11A is actually an octahedral structure, but is illustrated as a planar structure for simplicity. Note that three tetracoordinate O atoms exist in each of an upper half and a lower half in FIG. 11A. In the small group illustrated in FIG. 11A, electric charge is 0.

Figure 11D:
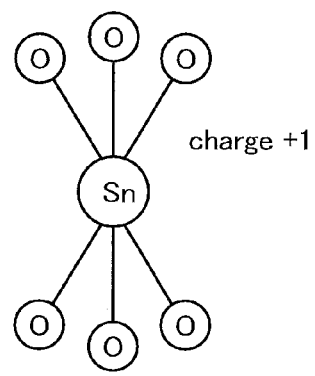
Figure 11B:
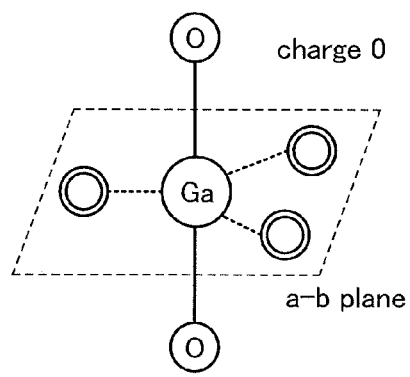

FIG. 11B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 11B. An In atom can also have the structure illustrated in FIG. 11B because an In atom can have five ligands. In the small group illustrated in FIG. 11B, electric charge is 0.

Figure 11E:
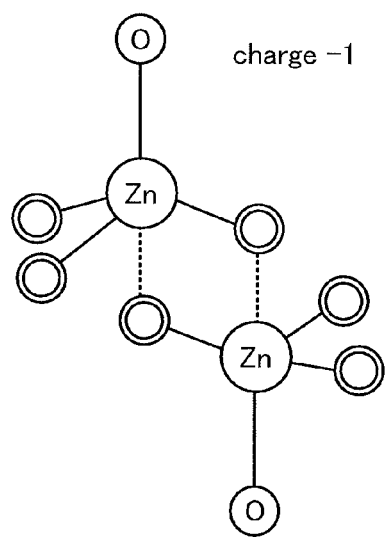
Figure 11C:
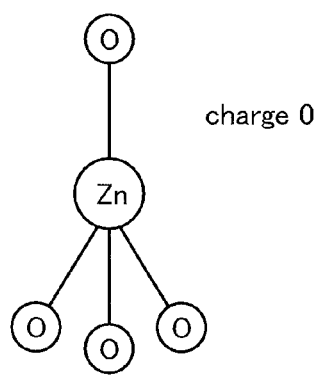

FIG. 11C illustrates a structure including one tetracoordinate Zn atom and four tetracoordinate O atoms proximate to the Zn atom. In FIG. 11C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 11C. In the small group illustrated in FIG. 11C, electric charge is 0.

FIG. 11D illustrates a structure including one hexacoordinate Sn atom and six tetracoordinate O atoms proximate to the Sn atom. In FIG. 11D, three tetracoordinate O atoms exist in each of an upper half and a lower half. In the small group illustrated in FIG. 11D, electric charge is +1.

FIG. 11E illustrates a small group including two Zn atoms. In FIG. 11E, one tetracoordinate O atom exists in each of an upper half and a lower half In the small group illustrated in FIG. 11E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 11A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. When the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 12A:
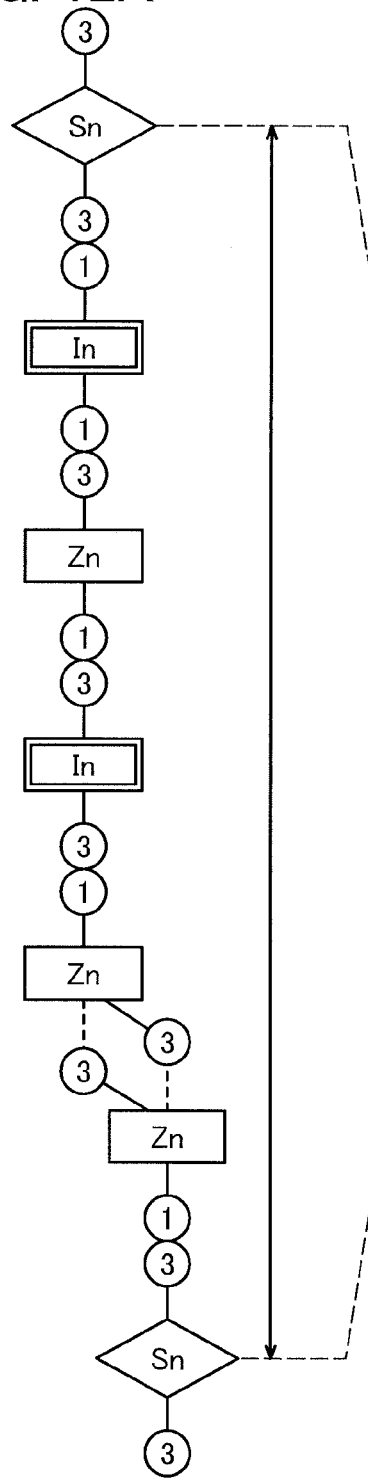
FIGS. 12A to 12C are views illustrating a crystal structure of an oxide material.
Figure 12B:
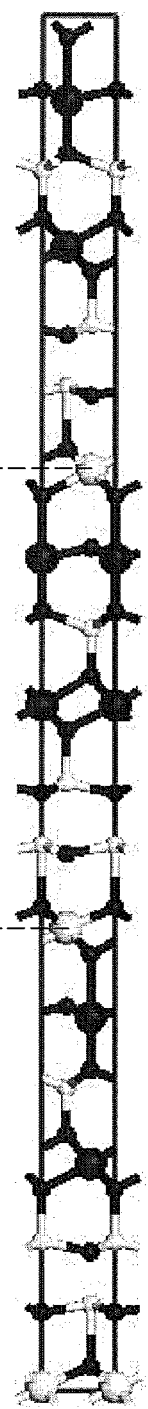
Figure 12C:
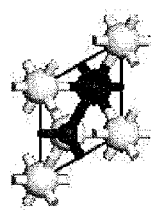

FIG. 12A illustrates a model of a medium group included in a layered structure of an In—Sn—Zn-based oxide. FIG. 12B illustrates a large group including three medium groups. Note that FIG. 12C illustrates an atomic arrangement in the case where the layered structure in FIG. 12B is observed from the c-axis direction.

In FIG. 12A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 12A, one tetracoordinate O atom existing in each of an upper half and a lower half with respect to an In atom is denoted by circled 1. FIG. 12A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 12A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is foamed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 11E can be given. For example, with one small group including two Zn atoms, electric charge of one small group including a Sn atom can be cancelled, so that the total electric charge of the layered structure can be 0.

When the large group illustrated in FIG. 12B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 13A:
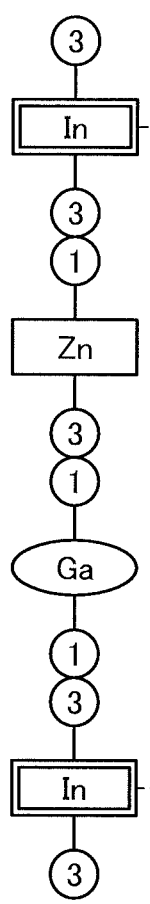
FIGS. 13A to 13C are views illustrating a crystal structure of an oxide material.

As an example, FIG. 13A illustrates a model of a medium group included in a layered structure of an In—Ga—Zn-based oxide.

In the medium group included in the layered structure of the In—Ga—Zn-based oxide in FIG. 13A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 13B:
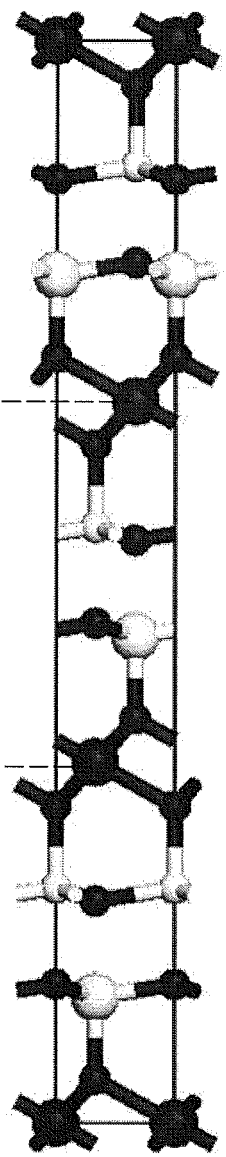
Figure 13C:
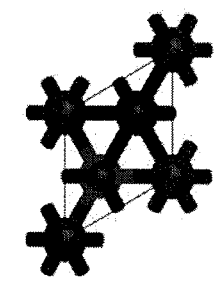

FIG. 13B illustrates a large group including three medium groups. Note that FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 13A but also a medium group in which the arrangement of the In atom, the Ga atom, and the Zn atom is different from that in FIG. 13A.

When the large group illustrated in FIG. 13B is repeated, crystal of an In—Ga—Zn-based oxide can be obtained. Note that a layered structure of the obtained In—Ga—Zn-based crystal can be expressed as a composition formula, $InGaO_3(ZnO)_n$ (n is a natural number).

Figure 14A:
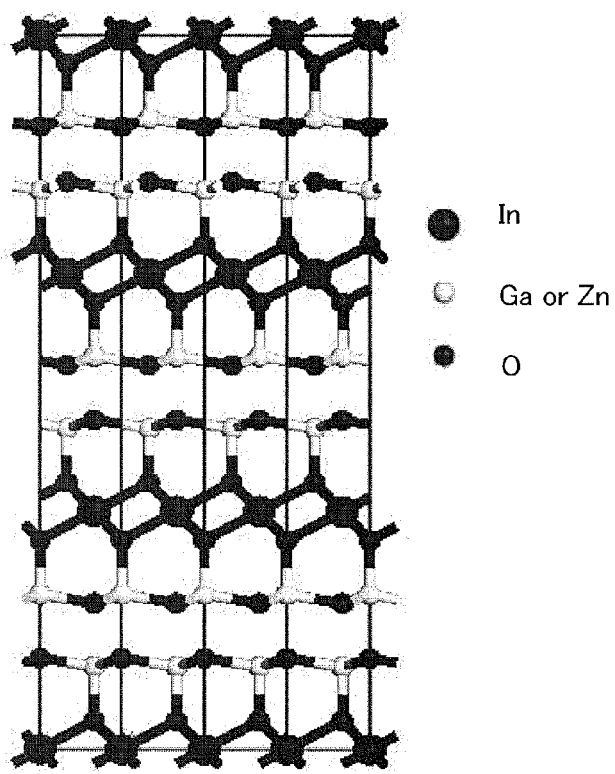
FIGS. 14A and 14B are views each illustrating a crystal structure of an oxide material.

In the case where n=1 (InGaZnO$_4$), a crystal structure illustrated in FIG. 14A can be obtained, for example. Note that in the crystal structure in FIG. 14A, since a Ga atom and an In atom each have five ligands as illustrated in FIG. 11B, a structure in which Ga is replaced with In can also be obtained.

Figure 14B:
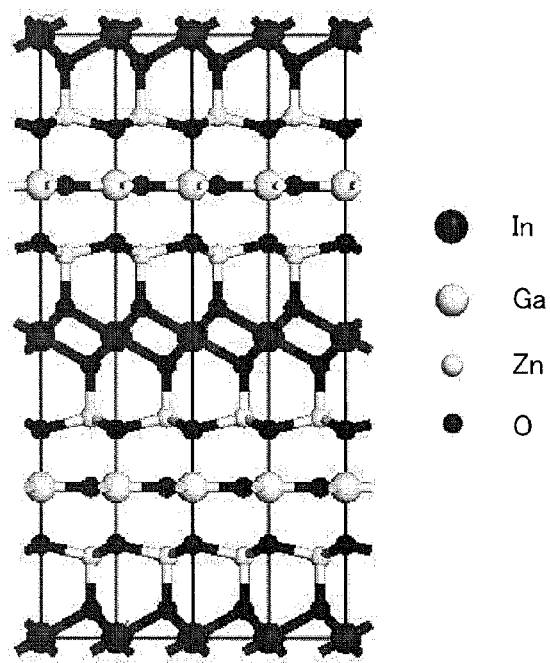

In the case where n=2 (InGaZn$_2$O$_5$), a crystal structure illustrated in FIG. 14B can be obtained, for example. Note that in the crystal structure in FIG. 14B, since a Ga atom and an In atom each have five ligands as described in FIG. 11B, a structure in which Ga is replaced with In can also be obtained.

Then, the oxide semiconductor layer 205 is formed by a sputtering method, an evaporation method, a PCVD method, a PLD method, an ALD method, an MBE method, or the like.

The oxide semiconductor layer 205 is formed in an oxygen gas atmosphere preferably by a sputtering method. At this time, the substrate temperature is set to higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor layer 205 is greater than or equal to 1 nm and less than or equal to 40 nm, preferably greater than or equal to 3 nm and less than or equal to 20 nm. As the substrate temperature in deposition is higher, the impurity concentration of the obtained oxide semiconductor layer 205 is lower. Further, the atomic arrangement in the oxide semiconductor layer 205 is ordered, the density thereof is increased, so that a polycrystal or a CAAC is likely to be formed. Furthermore, since an oxygen gas atmosphere is employed for the deposition, an unnecessary atom such as a rare gas element is not contained in the oxide semiconductor layer 205, so that a polycrystal or a CAAC is likely to be formed. Note that a mixed gas atmosphere including an oxygen gas and a rare gas may be used. In that case, the percentage of an oxygen gas is higher than or equal to 30 vol. %, preferably higher than or equal to 50 vol. %, further preferably higher than or equal to 80 vol. %. Note that as the oxide semiconductor layer 205 is thinner, a short-channel effect of a transistor is reduced. However, when the oxide semiconductor layer 205 is too thin, influence of interface scattering is enhanced; thus, the field effect mobility might be decreased (see FIG. 5B).

In the case of faulting the oxide semiconductor layer 205 using an In—Ga—Zn-based oxide by a sputtering method, it is preferable to use an In—Ga—Zn—O-based target having an atomic ratio of In:Ga:Zn=1:1:1, 4:2:3, 3:1:2, 1:1:2, 2:1:3, or 3:1:4. When the oxide semiconductor layer 205 is formed using an In—Ga—Zn—O-based target having the aforementioned atomic ratio, a polycrystal or a CAAC is likely to be formed. Note that an In—Ga—Zn-based oxide semiconductor can be referred to as IGZO. An In—Sn—Zn-based oxide semiconductor can be referred to as ITZO. In the case of forming the oxide semiconductor layer 205 using an In—Sn—Zn-based oxide by a sputtering method, it is preferable to use an In—Sn—Zn—O-based target having an atomic ratio of In:Sn:Zn=1:1:1, 2:1:3, 1:2:2, or 20:45:35. When the oxide semiconductor layer 205 is formed using an In—Sn—Zn—O-based target having the aforementioned atomic ratio, a polycrystal or a CAAC is likely to be formed.

The relative density of the metal oxide target is greater than or equal to 90% and less than or equal to 100%, preferably greater than or equal to 95% and less than or equal to 99.9%. With use of a metal oxide target with a high filling factor, the formed oxide semiconductor layer can have high density.

It is preferable that a high-purity gas from which impurities such as hydrogen, water, a hydroxyl group, and hydride are removed be used as a sputtering gas for the formation of the oxide semiconductor layer. For example, in the case where argon is used for the sputtering gas, it is preferable that the purity be 9 N, the dew point be −121° C., the content of H$_2$O be 0.1 ppb or lower, and the content of H$_2$ be 0.5 ppb or lower. In the case where oxygen is used for the sputtering gas, it is preferable that the purity be 8 N, the dew point be −112° C., the content of H$_2$O be 1 ppb or lower, and the content of H$_2$ be 1 ppb or lower.

Note that in the case where Al is used for the wiring layer formed through the first photolithography process, the substrate temperature is set to 380° C. or lower, preferably 350° C. or lower. Alternatively, in the case where Cu is used for the wiring layer formed through the first photolithography process, the substrate temperature is set to 450° C. or lower.

By heating the substrate during the deposition, the concentration of impurities such as hydrogen, moisture, hydride, or hydroxide in the oxide semiconductor layer can be reduced. In addition, damage by sputtering can be reduced. Then, a sputtering gas from which hydrogen and moisture are removed is introduced into the deposition chamber and moisture remaining therein is removed, and the oxide semiconductor layer 205 is formed with use of the above target.

In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, a hydrogen atom, a compound containing a hydrogen atom such as water (H$_2$O), (more preferably, also a compound containing a carbon atom), and the like are evacuated, whereby the impurity concentration in the oxide semiconductor layer formed in the deposition chamber can be reduced.

An example of the deposition conditions is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current power source is preferably used, in which case powder substances (also referred to as particles or dust) that are generated in deposition can be reduced and the film thickness can be uniform.

The concentrations of alkali metals such as sodium (Na), lithium (Li), and potassium (K) in the oxide semiconductor layer are as follows. The concentration of Na is $5 \times 10^{16}$ cm$^{-3}$ or lower, preferably $1 \times 10^{16}$ cm$^{-3}$ or lower, further preferably $1 \times 10^{15}$ cm$^{-3}$ or lower. The concentration of Li is $5 \times 10^{15}$ cm$^{-3}$ or lower, preferably $1 \times 10^{15}$ cm$^{-3}$ or lower. The concentration of K is $5 \times 10^{15}$ cm$^{-3}$ or lower, preferably $1 \times 10^{15}$ cm$^{-3}$ or lower.

Note that it has been pointed out that an oxide semiconductor is insensitive to impurities, there is no problem when a considerable amount of metal impurities is contained in the oxide semiconductor, and therefore, soda-lime glass which contains a large amount of an alkali metal such as sodium and is inexpensive can also be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). However, such consideration is not appropriate. An alkali metal is not an element included in an oxide semiconductor, and therefore, is an impurity. Also, an alkaline earth metal is an impurity in the case where an alkaline earth metal is not an element included in an oxide semiconductor. When an insulating layer in contact with the oxide semiconductor layer is an oxide, an alkali metal, in particular, Na diffuses into the insulating layer and Na becomes Na$^+$. Further, in the oxide semiconductor layer, Na cuts or enters a bond between metal and oxygen which are included in an oxide semiconductor. As a result, for example, deterioration of transistor characteristics, such as a normally-on state of the transistor due to shift of a threshold voltage in the negative direction, or reduction in mobility, occurs. In addition, variation in characteristics also occurs. Such deterioration of transistor characteristics and variation in characteristics due to an impurity remarkably appear when the hydrogen concentration in the oxide semiconductor layer is very low. Therefore, the concentration of an alkali metal in the oxide semiconductor is strongly required to set to the above value in the case where the hydrogen concentration in the oxide semiconductor is $5 \times 10^{19}$ cm$^{-3}$ or lower, particularly $5 \times 10^{18}$ cm$^{-3}$ or lower.

Next, first heat treatment is performed. By the first heat treatment, excessive hydrogen (including water and a hydroxyl group) in the oxide semiconductor layer is removed (dehydrated or dehydrogenated), whereby the impurity concentration in the oxide semiconductor layer can be reduced.

The first heat treatment is preferably performed at higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system). Note that in the case where Al is used for the wiring layer formed through the first photolithography process, the heat treatment temperature is set to 380° C. or lower, preferably 350° C. or lower. Alternatively, in the case where Cu is used for the wiring layer formed through the first photolithography process, the heat treatment temperature is set to 450° C. or lower. In this embodiment, the substrate is introduced into an electric furnace which is a kind of heat treatment apparatuses, and heat treatment is performed on the oxide semiconductor layer at 450° C. in a nitrogen atmosphere for one hour.

Note that a heat treatment apparatus is not limited to an electric furnace, and may include a device for heating an object to be processed by heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the first heat treatment can employ GRTA, in which the substrate is moved into an inert gas heated at high temperature, and heated for several minutes there, and then the substrate is moved out of the inert gas.

When the heat treatment is performed in an inert gas atmosphere such as a nitrogen atmosphere or a rare gas atmosphere, an oxygen atmosphere, or an ultra-dry air atmosphere, it is preferable that the atmosphere do not contain water, hydrogen, and the like. The purity of nitrogen, oxygen, or a rare gas which is introduced into a heat treatment apparatus is set to 6N (99.9999%) or higher, preferably 7N (99.99999%) or higher (that is, the impurity concentration is 1 ppm or lower, preferably 0.1 ppm or lower).

The first heat treatment is preferably performed in such a manner that heat treatment in a reduced pressure atmosphere or an inert gas atmosphere is completed and then, the atmosphere is changed to an oxidizing atmosphere while the temperature is kept, and heat treatment is further performed. By the heat treatment in a reduced pressure atmosphere or an inert gas atmosphere, the impurity concentration in the oxide semiconductor layer 205 can be reduced; however, at the same time, oxygen deficiency occurs. The oxygen deficiency generated at this time can be reduced by heat treatment in an oxidizing atmosphere.

The oxide semiconductor purified by a sufficient reduction in hydrogen concentration, in which defect levels in the energy gap due to oxygen deficiency are reduced as a result of sufficient supply of oxygen, has a carrier concentration of less than $1 \times 10^{12}$/cm$^3$, preferably less than $1 \times 10^{11}$/cm$^3$, further preferably less than $1.45 \times 10^{10}$/cm$^3$. For example, the off-state current (per unit channel width (1 µm) here) at room temperature (25° C.) is 100 zA/µm (1 zA (zeptoampere) is $1 \times 10^{-21}$ A) or lower, preferably 10 zA/µm or lower. The off-state current at 85° C. is 100 zA/µm ($1 \times 10^{-19}$ A/µm) or lower, preferably 10 zA/µm ($1 \times 10^{-20}$ A/µm) or lower. The transistor 111 with very excellent off-state current characteristics can be obtained with use of such an i-type (intrinsic) or substantially i-type oxide semiconductor.

The electric characteristics of a transistor including a highly purified oxide semiconductor, such as the threshold voltage and the on-state current, have almost no temperature dependence. Further, the transistor characteristics hardly change due to light deterioration.

As described above, variation in electric characteristics of a transistor including a highly purified and electrically i-type (intrinsic) oxide semiconductor obtained by reducing the oxygen deficiency is suppressed and thus, the transistor is electrically stable. Accordingly, a liquid crystal display device including an oxide semiconductor, which has high reliability and stable electric characteristics, can be provided.

Next, over the semiconductor layer 205, a conductive layer serving as the source electrode 206a, the drain electrode 206b, and the wiring 216 is formed. The conductive layer serving as the source electrode 206a, the drain electrode 206b, and the wiring 216 can be formed using a material and a method similar to those of the gate electrode 202. Further, the conductive layer used for the source electrode 206a, the drain electrode 206b, and the wiring 216 may be formed using a conductive metal oxide. As the conductive metal oxide, indium oxide (In$_2$O$_3$), tin oxide (SnO$_2$), zinc oxide (ZnO), indium oxide-tin oxide alloy (In$_2$O$_3$—SnO$_2$; abbreviated to ITO), indium oxide-zinc oxide alloy (In$_2$O$_3$—ZnO), or any of these metal oxide materials in which silicon oxide is contained can be used.

In this embodiment, as the conductive layer, a 5-nm-thick Ti layer is formed over the semiconductor layer 205, and a 250-nm-thick Cu layer is formed over the Ti layer. After that, through a second photolithography process, a resist mask is formed and the conductive layer is selectively etched, so that the source electrode 206a, the drain electrode 206b, and the wiring 216 are formed (see FIG. 5C).

Then, over the source electrode 206a, the drain electrode 206b, and the wiring 216, the insulating layer 207 is formed (see FIG. 6A). The insulating layer 207 can be formed using a material and a method similar to those of the gate insulating layer 204 or the base layer 201. A sputtering method is preferably employed for forming the insulating layer 207 in terms of low possibility of entry of hydrogen, water, and the like. If hydrogen is contained in the insulating layer 207, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to form the insulating layer 207 by a method through which hydrogen and impurities containing hydrogen are not contained therein.

For the insulating layer 207, an inorganic insulating material such as silicon oxide, silicon oxynitride, hafnium oxide, aluminum oxide, or gallium oxide can be used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the insulating layer 207 or may be formed on the insulating layer 207.

In this embodiment, as the insulating layer 207, a 200-nm-thick silicon oxide layer is formed by a sputtering method. The substrate temperature in deposition may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, a silicon oxide or silicon can be used. For example, with use of silicon for the target, a silicon oxide layer can be formed by sputtering in an atmosphere containing oxygen.

In order to remove moisture remaining in the deposition chamber at the time of formation of the insulating layer 207, an entrapment vacuum pump (e.g., a cryopump) is preferably used. The insulating layer 207 is formed in the deposition chamber evacuated using a cryopump, whereby the impurity concentration in the insulating layer 207 can be reduced. In addition, as an evacuation unit for removing moisture remaining in the deposition chamber used for depositing the insulating layer 207, a turbo molecular pump provided with a cold trap may be used.

It is preferable that a high-purity gas from which impurities such as hydrogen, water, a hydroxyl group, and hydride are removed be used as a sputtering gas used for the formation of the insulating layer 207.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for the wiring layer formed through the first and second photolithography processes, the heat treatment temperature is set to 380° C. or lower, preferably 350° C. or lower. Alternatively, in the case where Cu is used for the wiring layer, the heat treatment temperature is set to 450° C. or lower. For example, the third heat treatment may be performed in a nitrogen atmosphere at 450° C. for one hour. In the second heat treatment, part of the oxide semiconductor layer (channel formation region) is heated in the state where it is in contact with the insulating layer 207, and thus oxygen can be supplied from the insulating layer 207 including oxygen to the semiconductor layer 205. It is preferable that the above atmosphere do not contain water, hydrogen, and the like.

Next, through a third photolithography process, a resist mask is formed, and the insulating layer 207, the semiconductor layer 205, and the gate insulating layer 204 are selectively etched. At this time, over the drain electrode 206b, only the insulating layer 207 is etched and thus a contact hole 208 is formed. Over the wiring 216 in the cross section E1-E2, only the insulating layer 207 is etched and thus the contact hole 220 is formed. Over the wiring 212 in the cross section D1-D2, the insulating layer 207, the semiconductor layer 205, and the gate insulating layer 204 are etched, and thus a contact hole 219 is formed (see FIG. 6B).

At this time, the insulating layer 207, the semiconductor layer 205, and the gate insulating layer 204 in a pixel opening portion (a region where a conductive layer or a semiconductor layer is not formed in a pixel) are not necessarily etched. However, in the case where a liquid crystal display device is used as a transmissive liquid crystal display device, when the insulating layer 207, the semiconductor layer 205, and the gate insulating layer 204 in the pixel opening portion are etched as much as possible, the transmittance of a pixel is increased. Accordingly, a pixel transmits light from a backlight efficiently, and thus reduction in power consumption or improvement in display quality due to increase in luminance can be possible; therefore, the etching of the insulating layer 207, the semiconductor layer 205, and the gate insulating layer 204 in the pixel opening portion is preferable.

For the etching of the insulating layer 207, the semiconductor layer 205, and the gate insulating layer 204, either dry etching or wet etching or both may be employed. For example, a gas containing chlorine (a chlorine-based gas such as chlorine ($Cl_2$), boron trichloride ($BCl_3$), silicon tetrachloride ($SiCl_4$), or tetrachloromethane ($CCl_4$)) can be employed as an etching gas used for the dry etching.

For the dry etching, a parallel plate reactive ion etching (RIE) method or an inductively coupled plasma (ICP) etching method can be used. The etching conditions are preferably set so that the base layer 201 is not etched as much as possible because the base layer 201 has a function of preventing diffusion of an impurity element from the substrate 200.

In general, etching of a semiconductor layer and formation of a contact hole in an insulating layer are performed separately by different photolithography processes and different etching steps; however, according to the manufacturing process of this embodiment, the etching of a semiconductor layer and the formation of a contact hole in an insulating layer can be performed simultaneously by one photolithography process and one etching step. Therefore, not only reduction in the number of photomasks, but also reduction in the number of photolithography processes can be achieved. Owing to reduction in the number of photolithography processes, a liquid crystal display device can be manufactured at low cost with high productivity.

In addition, according to the manufacturing process of this embodiment, a photoresist is not directly formed on the oxide semiconductor layer. Further, since the channel formation region in the oxide semiconductor layer is protected by the insulating layer 207, moisture is not attached to the channel formation region in the oxide semiconductor layer in separation and cleaning steps of the photoresist; thus, variation in characteristics of the transistor 111 is reduced and the reliability is increased.

Next, over the insulating layer 207, a light-transmitting conductive layer serving as the pixel electrode 210, the electrode 221, and the electrode 222 is formed with a thickness of greater than or equal to 30 nm and less than or equal to 200 nm, preferably greater than or equal to 50 nm and less than or equal to 100 nm by a sputtering method, a vacuum evaporation method, or the like (see FIG. 6C).

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Alternatively, a material formed of 1 to 10 graphene sheets (1 graphene sheet corresponds to one layer of graphite) may be used.

In this embodiment, as the light-transmitting conductive layer, a 80-nm-thick ITO layer is formed, and through a fourth photolithography process, a resist mask is formed and the light-transmitting conductive layer is selectively etched, whereby the pixel electrode 210, the electrode 221, and the electrode 222 are formed.

The pixel electrode 210 is electrically connected to the drain electrode 206b through the contact hole 208. The electrode 221 is electrically connected to the wiring 212 through the contact hole 219. The electrode 222 is electrically connected to the wiring 216 through the contact hole 220.

In the contact hole 219 and the contact hole 220, it is important that the wiring 212 and the wiring 216 be not kept exposed and be covered with an oxide conductive material such as ITO. Since the wiring 212 and the wiring 216 are metal layers, if the wiring 212 and the wiring 216 are kept exposed, the exposed surfaces are oxidized and contact resistance with a FPC or the like is increased, leading to reduction in reliability. The exposed surfaces of the wiring 212 and the wiring 216 are covered with an oxide conductive material such as ITO, whereby increase in contact resistance is prevented and thus the reliability of the liquid crystal display device can be improved.

According to this embodiment, a liquid crystal display device can be manufactured through fewer photolithography processes as compared with the conventional case. Consequently, a liquid crystal display device can be manufactured at low cost with high productivity.

This embodiment can be freely combined with any of the other embodiments.

(Embodiment 2)

Figure 7A:
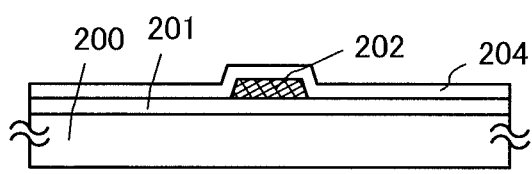
FIGS. 7A to 7C are cross-sectional views illustrating one embodiment of the present invention.
Figure 7B:
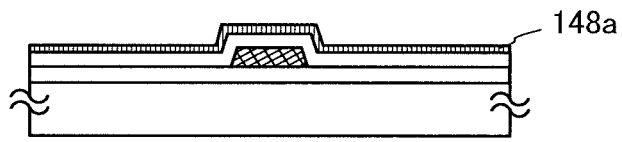
Figure 7C:
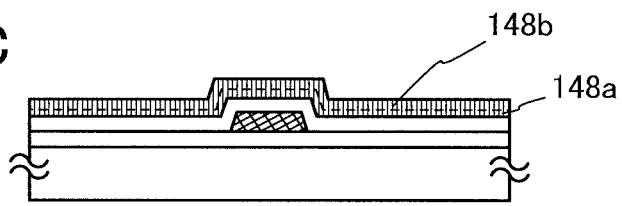

In this embodiment, a process example partly different from that described in Embodiment 1 is described with reference to FIGS. 7A to 7C. Note that the same reference numerals are used for the same parts as those in Embodiment 1, and description of the parts with the same reference numerals is omitted here.

First, as in Embodiment 1, a conductive layer is formed over the substrate 200 having an insulating surface, and then, the gate electrode 202 is formed through the first photolithography process and an etching step.

An insulating layer serving as a base layer may be formed between the substrate 200 and the gate electrode 202. In this embodiment, the base layer 201 is formed. The base layer 201 has a function of preventing diffusion of an impurity element (e.g., Na) from the substrate 200, and can be formed using a film selected from a silicon oxide film, a silicon oxynitride film, a silicon nitride film, a hafnium oxide film, an aluminum oxide film, a gallium oxide film, and a gallium aluminum oxide film. The structure of the base layer 201 is not limited to a single-layer structure, and may be a stacked structure of a plurality of the above films In this embodiment, the deposition temperature of a semiconductor layer formed later is higher than or equal to 200° C. and lower than or equal to 450° C., and the temperature of heat treatment performed after the formation of the semiconductor layer is higher than or equal to 200° C. and lower than or equal to 450° C. Therefore, for the gate electrode 202, a stacked structure in which copper is a lower layer and molybdenum is an upper layer, or a stacked structure in which copper is a lower layer and tungsten is an upper layer is employed.

Next, as in Embodiment 1, the gate insulating layer 204 is formed over the gate electrode 202 by a CVD method, a sputtering method, or the like. FIG. 7A is a cross-sectional view illustrating the structure obtained through the steps up to and including this step.

Then, over the gate insulating layer 204, a first oxide semiconductor layer is formed with a thickness of greater than or equal to 1 nm and less than or equal to 10 nm. In this embodiment, the first oxide semiconductor layer is formed with a thickness of 5 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$:ZnO=1:1:2 [molar ratio]) is used; the distance between the substrate and the target is 170 mm; the substrate temperature is 250° C.; the pressure is 0.4 Pa; and the direct current (DC) power source is 0.5 kW.

After that, the first heat treatment is performed with the substrate placed in a nitrogen atmosphere or a dry air atmosphere. The temperature of the first heat treatment is set to higher than or equal to 200° C. and lower than or equal to 450° C. In the first heat treatment, heating is performed for greater than or equal to one hour and less than or equal to 24 hours. Through the first heat treatment, a first crystalline oxide semiconductor layer 148a is formed (see FIG. 7B).

Next, a second oxide semiconductor layer is formed with a thickness greater than 10 nm over the first crystalline oxide semiconductor layer 148a. In this embodiment, the second oxide semiconductor layer is formed with a thickness of 25 nm in an oxygen atmosphere, an argon atmosphere, or a mixed atmosphere of argon and oxygen under the following conditions: a target for an oxide semiconductor (a target for an In—Ga—Zn-based oxide semiconductor ($In_2O_3$:$Ga_2O_3$:ZnO=1:1:2 [molar ratio]) is used; the distance between the substrate and the target is 170 mm; the substrate temperature is 400° C.; the pressure is 0.4 Pa; and the direct current (DC) power source is 0.5 kW.

Then, the second heat treatment is performed with the substrate placed in a nitrogen atmosphere or a dry air atmosphere. The temperature of the second heat treatment is set to higher than or equal to 200° C. and lower than or equal to 450° C. In the second heat treatment, heating is performed for greater than or equal to one hour and less than or equal to 24 hours. Through the second heat treatment, a second crystalline oxide semiconductor layer 148b is formed (see FIG. 7C).

In the subsequent steps, the source electrode 206a, the drain electrode 206b, the insulating layer 207, and the like are formed according to Embodiment 1. The insulating layer 207, the first crystalline oxide semiconductor layer 148a, and the second crystalline oxide semiconductor layer 148b are etched with one resist mask so that the number of photolithography processes is reduced.

In this manner, the transistor 111 can be obtained according to Embodiment 1. Note that in the case where this embodiment is employed, the semiconductor layer including a channel formation region of such a transistor has a stacked structure of the first crystalline oxide semiconductor layer 148a and the second crystalline oxide semiconductor layer 148b. The first crystalline oxide semiconductor layer 148a and the second crystalline oxide semiconductor layer 148b have c-axis alignment. The first crystalline oxide semiconductor layer 148a and the second crystalline oxide semiconductor layer 148b comprise an oxide including a crystal with c-axis alignment (also referred to as C-Axis Aligned Crystal (CAAC)), which has neither a single crystal structure nor an amorphous structure. Note that the first crystalline oxide semiconductor layer 148a and the second crystalline oxide semiconductor layer 148b partly have a crystal grain boundary.

The transistor having a stacked structure of the first crystalline oxide semiconductor layer and the second crystalline oxide semiconductor layer has stable electric characteristics. When the transistor is irradiated with light or subjected to a bias-temperature (BT) test, the amount of change of threshold voltage of the transistor can be suppressed.

This embodiment can be freely combined with any of the other embodiments.

(Embodiment 3)

Figure 8A:
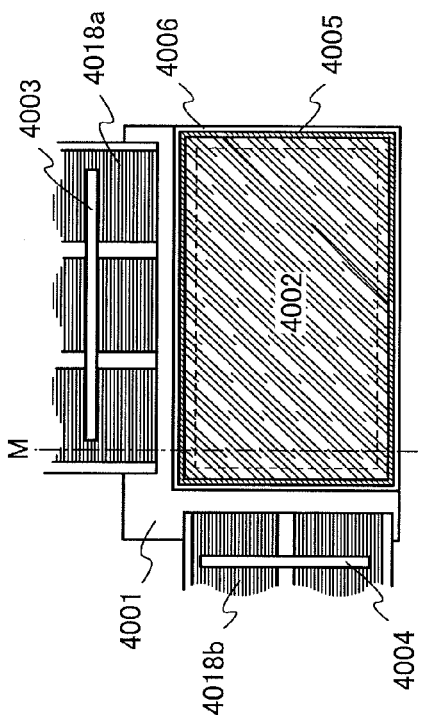
FIGS. 8A and 8B are a top view and a cross-sectional view illustrating one embodiment of the present invention.
Figure 8B:
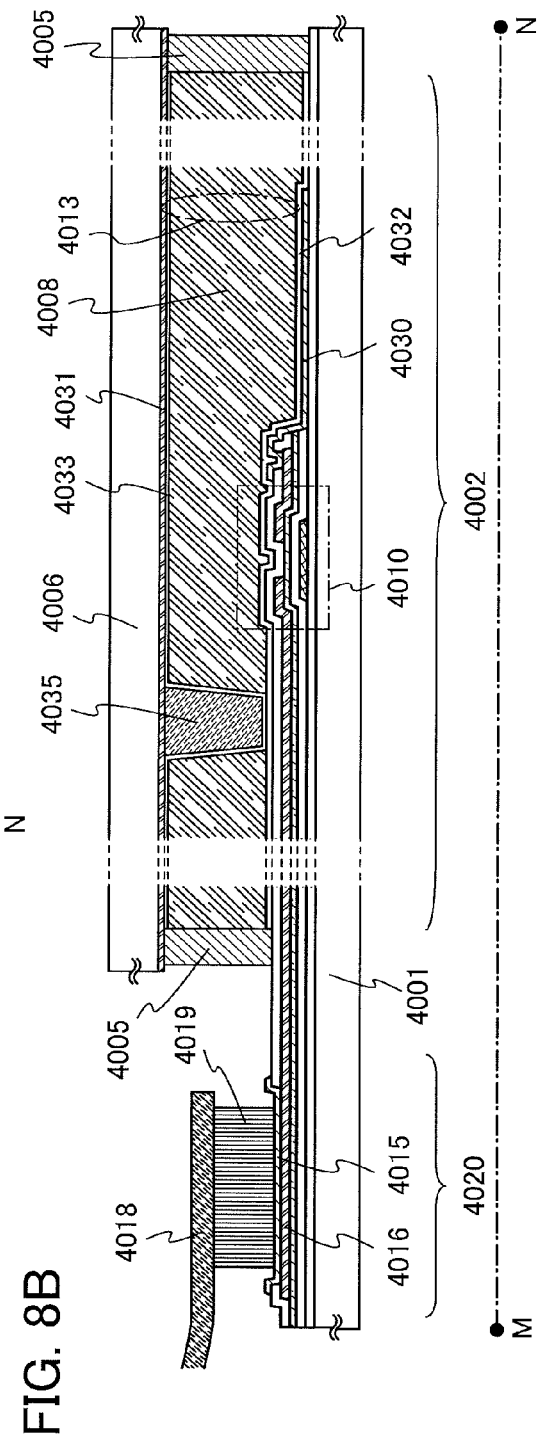

One mode of a display device including the transistor described in Embodiment 1 and Embodiment 2 is illustrated in FIGS. 8A and 8B.

FIG. 8A is a plan view of a panel in which a transistor 4010 and a liquid crystal element 4013 are sealed between a first substrate 4001 and a second substrate 4006 with a sealant 4005. FIG. 8B is a cross-sectional view taken along line M-N in FIG. 8A.

The sealant 4005 is provided so as to surround a pixel portion 4002 provided over the first substrate 4001, and the second substrate 4006 is provided over the pixel portion 4002. Accordingly, the pixel portion 4002 is sealed together with a liquid crystal layer 4008 by the first substrate 4001, the sealant 4005, and the second substrate 4006.

An input terminal 4020 is provided in a region that is different from the region surrounded by the sealant 4005 over the first substrate 4001. Flexible printed circuits (FPCs) 4018a and 4018b are connected to the input terminal 4020. The FPC 4018a is electrically connected to a signal line driver circuit 4003 formed over a different substrate, and the FPC 4018b is electrically connected to a scan line driver circuit 4004 formed over a different substrate. Signals and potentials to the pixel portion 4002 are supplied from the signal line driver circuit 4003 and the scan line driver circuit 4004 through the FPC 4018a and the FPC 4018b.

Note that a connection method of a driver circuit separately formed over a different substrate is not particularly limited, and a chip on glass (COG) method, a wire bonding method, a tape carrier package (TCP) method, a tape automated bonding (TAB) method, or the like can be used.

As the display element provided in the display device, a liquid crystal element (also referred to as a liquid crystal display element) can be used. Alternatively, a display medium whose contrast is changed by an electric effect, such as electronic ink, can be used.

A semiconductor device illustrated in FIGS. 8A and 8B includes an electrode 4015 and a wiring 4016. The electrode 4015 and the wiring 4016 are electrically connected to a terminal included in an FPC 4018 through an anisotropic conductive layer 4019.

The electrode 4015 is formed from the same conductive layer as a first electrode 4030, and the wiring 4016 is formed from the same conductive layer as a source electrode and a drain electrode of a transistor 4010.

In this embodiment, any of the transistors described in Embodiment 1 and Embodiment 2 can be applied to the transistor 4010. The transistor 4010 included in the pixel portion 4002 is electrically connected to a display element to form a display panel. There is no particular limitation on the kind of the display element as long as display can be performed, and various kinds of display elements can be employed.

An example of a display device using a liquid crystal element as a display element is illustrated in FIGS. 8A and 8B. In FIGS. 8A and 8B, a liquid crystal element 4013 which is a display element includes the first electrode 4030, a second electrode 4031, and a liquid crystal layer 4008. Note that insulating layers 4032 and 4033 serving as alignment films are provided so that the liquid crystal layer 4008 is interposed therebetween. The second electrode 4031 is provided on the second substrate 4006 side, and the first electrode 4030 and the second electrode 4031 are stacked, with the liquid crystal layer 4008 interposed therebetween.

A columnar spacer denoted by reference numeral 4035 is formed using an insulating layer over the second substrate 4006 and is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral agent has a short response time of less than or equal to 1 msec, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. By using a transistor in which a high-purity oxide semiconductor is used for a semiconductor layer including a channel formation region, it is enough to provide a storage capacitor having a capacitance that is less than or equal to ⅓, preferably less than or equal to ⅕ of a liquid crystal capacitance of each pixel.

In the transistor used in this embodiment, which includes a highly purified oxide semiconductor layer, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption. In the transistor including a highly purified oxide semiconductor layer, the potential applied to the liquid crystal element can be kept even when the storage capacitor is not provided.

In the transistor including a highly purified oxide semiconductor layer used in this embodiment, relatively high field-effect mobility can be obtained, whereby high-speed operation is possible. Consequently, when the above transistor is used in a pixel portion of a liquid crystal display device, high-quality images can be obtained. In addition, since the transistor for a driver circuit portion and the transistor for the pixel portion can be formed over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally-black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, and the like can be given. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with use of a plurality of light-emitting diodes (LEDs) as a backlight. By employing a field-sequential driving method, color display can be performed without using a color filter.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to the application to a liquid crystal display device for color display but can also be applied to a liquid crystal display device for monochrome display.

In FIGS. 8A and 8B, as the first substrate 4001 and the second substrate 4006, flexible substrates, for example, plastic substrates having a light-transmitting property or the like can be used, in addition to glass substrates. As plastic, a fiberglass-reinforced plastic (FRP) plate, a polyvinyl fluoride (PVF) film, a polyester film, or an acrylic resin film can be used. In addition, a sheet with a structure in which an aluminum foil is sandwiched between PVF films or polyester films can be used.

The liquid crystal display device displays an image by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, the pattern structure of the electrode, and the like.

The first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide containing titanium oxide, or indium tin oxide (hereinafter referred to as ITO), indium zinc oxide, or ITO to which silicon oxide is added. Alternatively, a material formed of 1 to 10 graphene sheets (corresponding to one layer of graphite) may be used.

One of the first electrode 4030 and the second electrode 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode 4030 and the second electrode 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

Since the transistor is easily broken owing to static electricity or the like, a protective circuit is preferably provided. The protective circuit is preferably foamed using a nonlinear element.

As described above, by using any of the transistors exemplified in Embodiment 1 and Embodiment 2, the highly reliable liquid crystal display device can be provided. Note that the transistors exemplified in Embodiment 1 and Embodiment 2 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

This embodiment can be freely combined with any of the other embodiments.

(Embodiment 4)

In this embodiment, with use of a display device which switches an image for a left eye and an image for a right eye at high speed, an example in which a 3D image which is a moving image or a still image is seen with dedicated glasses with which videos of the display device are synchronized is described with reference to FIGS. 9A and 9B.

Figure 9A:
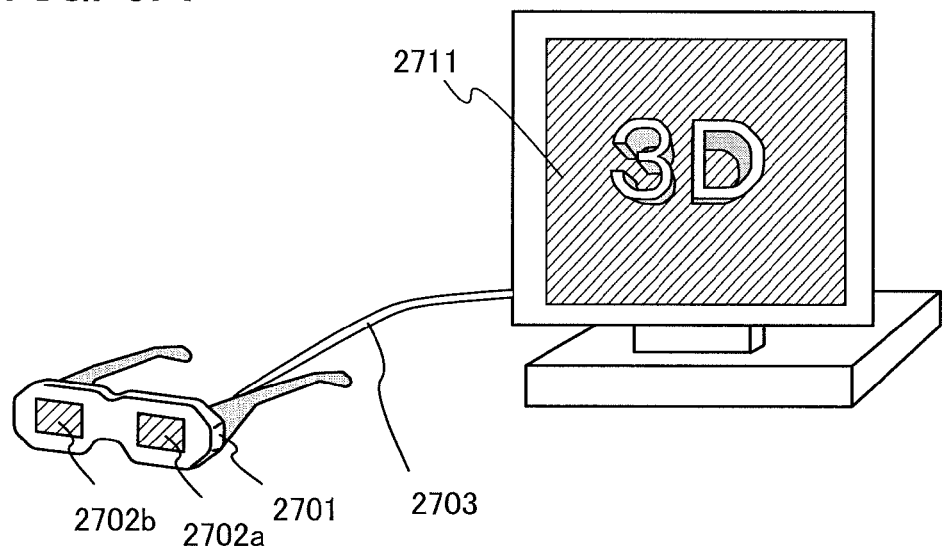
FIGS. 9A and 9B are views illustrating one embodiment of the present invention.

FIG. 9A illustrates an external view in which a display device 2711 and dedicated glasses 2701 are connected to each other with a cable 2703. In the dedicated glasses 2701, shutters provided in a panel 2702*a* for a left eye and a panel 2702*b* for a right eye are alternately opened and closed, whereby a user can see an image of the display device 2711 as a 3D image.

Figure 9B:
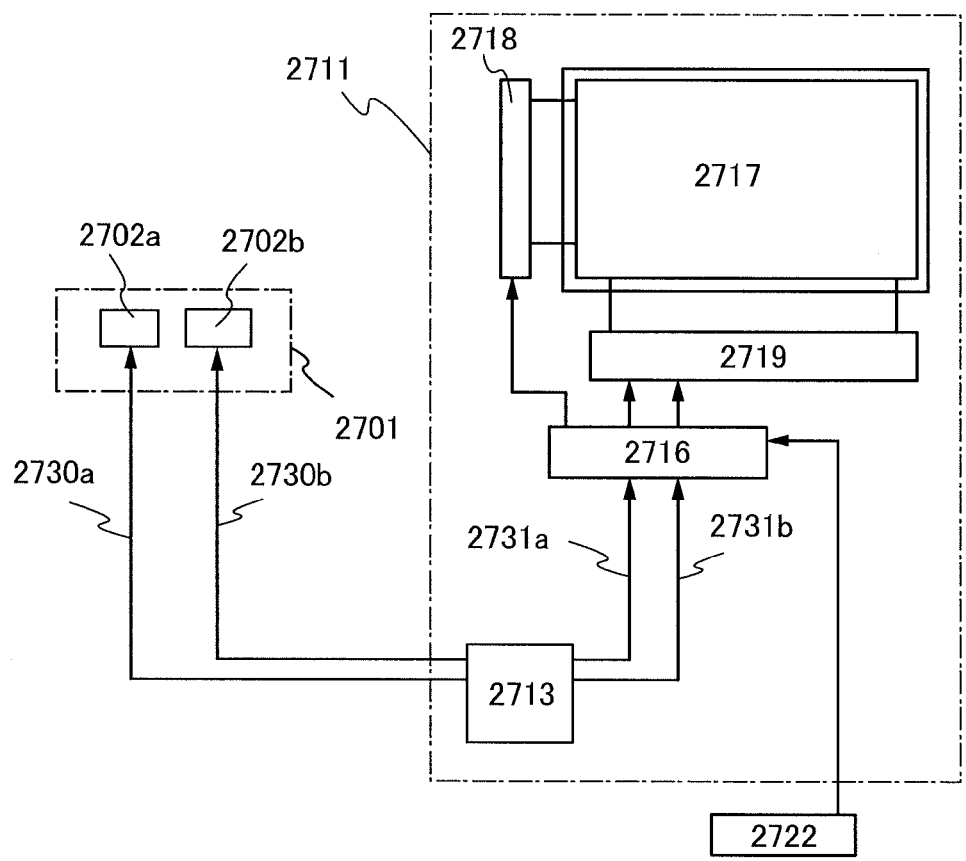

In addition, FIG. 9B is a block diagram illustrating a main structure of the display device 2711 and the dedicated glasses 2701.

The display device 2711 illustrated in FIG. 9B includes a display control circuit 2716, a display portion 2717, a timing generator 2713, a source line driver circuit 2718, an external operation unit 2722, and a gate line driver circuit 2719. Note that an output signal changes in accordance with operation by the external operation unit 2722 such as a keyboard.

In the timing generator 2713, a start pulse signal and the like are formed, and a signal for synchronizing an image for a left eye and the shutter of the panel 2702a for a left eye, a signal for synchronizing an image for a right eye and the shutter of the panel 2702b for a right eye, and the like are formed.

A synchronization signal 2731a of the image for a left eye is input to the display control circuit 2716, so that the image for a left eye is displayed on the display portion 2717. At the same time, a synchronization signal 2730a for opening the shutter of the panel 2702a for a left eye is input to the panel 2702a for a left eye. In addition, a synchronization signal 2731b of the image for a right eye is input to the display control circuit 2716, so that the image for a right eye is displayed on the display portion 2717. At the same time, a synchronization signal 2730b for opening the shutter of the panel 2702b for a right eye is input to the panel 2702b for a right eye.

Since an image for a left eye and an image for a right eye are switched at high speed, the display device 2711 preferably employs a successive color mixing method (a field sequential method) in which color display is performed by time division with use of light-emitting diodes (LEDs).

Further, since a field sequential method is employed, it is preferable that the timing generator 2713 input the synchronization signals 2730a and 2730b to the backlight portion of the light-emitting diodes. Note that the backlight portion includes LEDs of R, G, and B colors.

This embodiment can be implemented in appropriate combination with the structure described in any of the other embodiments.

(Embodiment 5)

In this embodiment, examples of electronic devices each including the display device described in the above embodiment will be described.

Figure 10A:
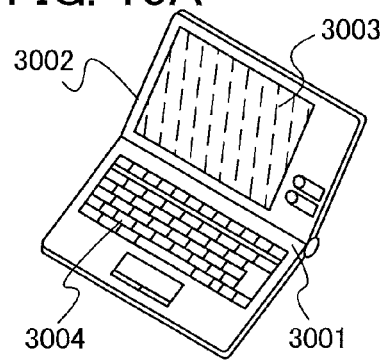
FIGS. 10A to 10F are views each illustrating an application example of an electronic device.

FIG. 10A illustrates a laptop personal computer, which includes a main body 3001, a housing 3002, a display portion 3003, a keyboard 3004, and the like. By using the liquid crystal display device described in any of the above embodiments, a highly reliable laptop personal computer can be obtained.

Figure 10B:
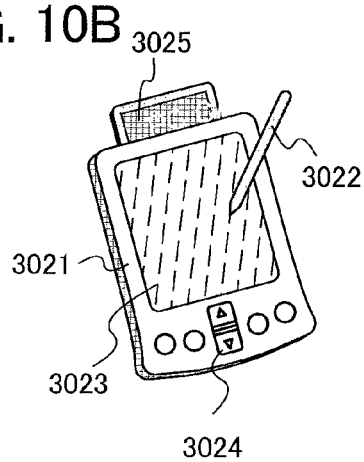

FIG. 10B is a personal digital assistant (PDA) including a display portion 3023, an external interface 3025, an operation button 3024, and the like in a main body 3021. A stylus 3022 is included as an accessory for operation. By using the liquid crystal display device described in any of the above embodiments, a highly reliable personal digital assistant (PDA) can be obtained.

Figure 10C:
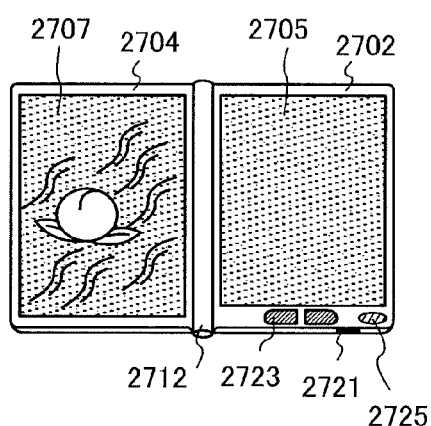

FIG. 10C illustrates an example of an electronic book reader. For example, the electronic book reader includes two housings, a housing 2702 and a housing 2704. The housing 2702 and the housing 2704 are combined with a hinge 2712 so that the electronic book reader can be opened and closed with the hinge 2712 as an axis. With such a structure, the electronic book reader can operate like a paper book.

A display portion 2705 and a display portion 2707 are incorporated in the housing 2702 and the housing 2704, respectively. The display portion 2705 and the display portion 2707 may display one image or different images. In the case where the display portion 2705 and the display portion 2707 display different images, for example, a display portion on the right side (the display portion 2705 in FIG. 10C) can display text and a display portion on the left side (the display portion 2707 in FIG. 10C) can display images. By using the liquid crystal display device described in any of the above embodiments, a highly reliable electronic book reader can be obtained.

FIG. 10C illustrates an example in which the housing 2702 includes an operation portion and the like. For example, the housing 2702 is provided with a power supply terminal 2721, operation keys 2723, a speaker 2725, and the like. With the operations key 2723, pages can be turned. Note that a keyboard, a pointing device, or the like may also be provided on the surface of the housing, where the display portion is provided. Furthermore, an external connection terminal (an earphone terminal, a USB terminal, or the like), a recording medium insertion portion, and the like may be provided on the rear surface or the side surface of the housing. Further, the electronic book reader may have a function of an electronic dictionary.

The electronic book reader may transmit and receive data wirelessly. Through wireless communication, desired book data or the like can be purchased and downloaded from an electronic book server.

Figure 10D:
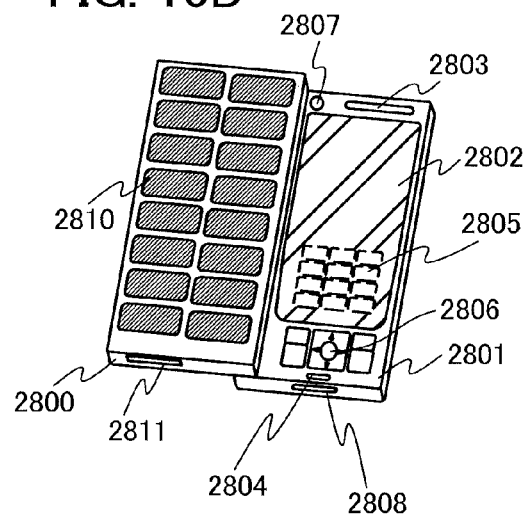

FIG. 10D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar battery 2810 having a function of charge of the personal digital assistant, an external memory slot 2811, and the like. Further, an antenna is incorporated in the housing 2801.

Further, the display panel 2802 includes a touch panel. A plurality of operation keys 2805 which are displayed as images are indicated by dashed lines in FIG. 10D. Note that a boosting circuit by which a voltage output from the solar battery 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Furthermore, the housings 2800 and 2801 which are developed as illustrated in FIG. 10D can overlap with each other by sliding; thus, the size of the mobile phone can be decreased, which makes the mobile phone suitable for being carried.

The external connection terminal 2808 can be connected to an AC adapter and various types of cables such as a USB cable, and charge and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided. By using the liquid crystal display device described in any of the above embodiments, a highly reliable mobile phone can be provided.

Figure 10E:
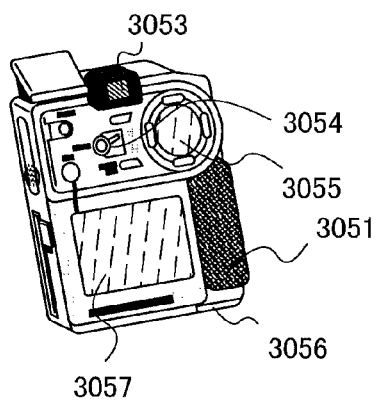

FIG. 10E illustrates a digital video camera which includes a main body 3051, a display portion A 3057, an eyepiece 3053, an operation switch 3054, a display portion B 3055, a battery 3056, and the like. By using the liquid crystal display device described in any of the above embodiments, a highly reliable digital video camera can be provided.

Figure 10F:
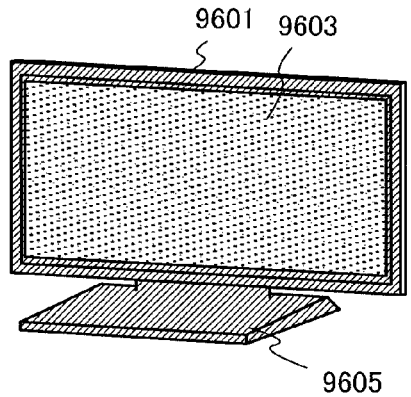

FIG. 10F illustrates an example of a television set. In the television set, a display portion 9603 is incorporated in a housing 9601. The display portion 9603 can display images. Here, the housing 9601 is supported by a stand 9605. By using the liquid crystal display device described in any of the above embodiments, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) data communication can be performed.

This embodiment can be implemented in appropriate combination with the structure described in any of the other embodiments.

This application is based on Japanese Patent Application serial no. 2010-190856 filed with Japan Patent Office on Aug. 27, 2010, the entire contents of which are hereby incorporated by reference.

What is claimed is:

1. A manufacturing method of a liquid crystal display device, comprising the steps of:
   forming a gate electrode over a substrate through a first photolithography process;
   forming a gate insulating layer over the gate electrode;
   forming a semiconductor layer over the gate insulating layer;
   forming a source electrode and a drain electrode over the semiconductor layer through a second photolithography process;
   forming an insulating layer over the source electrode and the drain electrode;
   through a third photolithography process, forming a contact hole by removing a first part of the insulating layer, and forming an island-like semiconductor layer by removing a second part of the insulating layer, a part of the semiconductor layer, and a part of the gate insulating layer; and
   forming a pixel electrode over the insulating layer through a fourth photolithography process,
   wherein the source electrode and the drain electrode are in contact with the island-like semiconductor layer,
   wherein the first part of the insulating layer overlaps with the drain electrode, and
   wherein the second part of the insulating layer, the part of the semiconductor layer and the part of the gate insulating layer do not overlap with the source electrode and the drain electrode.

2. The manufacturing method of the liquid crystal display device, according to claim 1, further comprising the step of forming a base layer over the substrate before forming the gate electrode.

3. The manufacturing method of the liquid crystal display device, according to claim 1, wherein the semiconductor layer comprises an oxide semiconductor.

4. The manufacturing method of the liquid crystal display device according to claim 1, wherein at least one of the gate electrode, the source electrode, and the drain electrode comprises a material comprising copper.

5. The manufacturing method of the liquid crystal display device, according to claim 4, wherein a maximum process temperature at the time after the formation of at least the one of the gate electrode, the source electrode, or the drain electrode is 450° C. or lower.

6. The manufacturing method of the liquid crystal display device, according to claim 1, wherein at least one of the gate electrode, the source electrode, and the drain electrode comprises a material comprising aluminum.

7. The manufacturing method of the liquid crystal display device, according to claim 6, wherein a maximum process temperature at the time after the formation of at least the one of the gate electrode, the source electrode, and the drain electrode is 380° C. or lower.

8. The manufacturing method of the liquid crystal display device, according to claim 1,
   wherein the source electrode has a U-shape, and
   wherein the drain electrode is partly surrounded by the U-shaped source electrode.

9. A manufacturing method of a semiconductor device, comprising the steps of:
   forming a gate electrode over a substrate;
   forming a gate insulating layer over the gate electrode;
   forming a semiconductor layer over the gate insulating layer;
   forming a source electrode and a drain electrode over the semiconductor layer;
   forming an insulating layer over the source electrode and the drain electrode; and
   through a photolithography process, forming a contact hole in the insulating layer by removing a first part of the insulating layer, and forming a patterned semiconductor layer by removing a second part of the insulating layer, a part of the semiconductor layer and a part of the gate insulating layer,
   wherein the source electrode and the drain electrode are in contact with the patterned semiconductor layer,
   wherein the first part of the insulating layer overlaps with the drain electrode, and
   wherein the second part of the insulating layer, the part of the semiconductor layer and the part of the gate insulating layer do not overlap with the source electrode and the drain electrode.

10. The manufacturing method of the semiconductor device, according to claim 9, further comprising the step of forming a base layer over the substrate before forming the gate electrode.

11. The manufacturing method of the semiconductor device, according to claim 9, wherein the semiconductor layer comprises an oxide semiconductor.

12. The manufacturing method of the semiconductor device according to claim 9, wherein at least one of the gate electrode, the source electrode, and the drain electrode comprises a material comprising copper.

13. The manufacturing method of the semiconductor device, according to claim 12, wherein a maximum process temperature at the time after the formation of at least the one of the gate electrode, the source electrode, or the drain electrode is 450° C. or lower.

14. The manufacturing method of the semiconductor device, according to claim 9, wherein at least one of the gate electrode, the source electrode, and the drain electrode comprises a material comprising aluminum.

15. The manufacturing method of the semiconductor device, according to claim 14, wherein a maximum process temperature at the time after the formation of at least the one of the gate electrode, the source electrode, and the drain electrode is 380° C. or lower.

16. The manufacturing method of the semiconductor device, according to claim 9, wherein the gate electrode is formed through a photolithography process.

17. The manufacturing method of the semiconductor device, according to claim 9, wherein the source electrode and the drain electrode are formed through a photolithography process.

18. The manufacturing method of the semiconductor device, according to claim 9,
wherein the source electrode has a U-shape, and
wherein the drain electrode is partly surrounded by the U-shaped source electrode.

19. The manufacturing method of the semiconductor device, according to claim 9, wherein the semiconductor device is an active matrix liquid crystal display device.

20. The manufacturing method of the semiconductor device, according to claim 9, wherein the semiconductor device is one selected from the group consisting of a memory device, an imaging device, a display device, an electro-optical device, and an electronic device.

21. A manufacturing method of a semiconductor device, comprising the steps of:
forming a gate electrode over a substrate;
forming a gate insulating layer over the gate electrode;
forming a semiconductor layer over the gate insulating layer;
forming a U-shaped source electrode and a drain electrode over the semiconductor layer; and
forming an insulating layer over the U-shaped source electrode and the drain electrode;
forming a contact hole in the insulating layer by removing a first part of the insulating layer, and forming a patterned semiconductor layer by removing a second part of the insulating layer, a part of the semiconductor layer and a part of the gate insulating layer,
wherein the U-shaped source electrode and the drain electrode are in contact with the patterned semiconductor layer,
wherein the first part of the insulating layer overlaps with the drain electrode, and
wherein the second part of the insulating layer, the part of the semiconductor layer and the part of the gate insulating layer are located outside the U-shaped source electrode.

22. The manufacturing method of the semiconductor device, according to claim 21, further comprising the step of forming a base layer over the substrate before forming the gate electrode.

23. The manufacturing method of the semiconductor device, according to claim 21, wherein the semiconductor layer comprises an oxide semiconductor.

24. The manufacturing method of the semiconductor device according to claim 21, wherein at least one of the gate electrode, the U-shaped source electrode, and the drain electrode comprises a material comprising copper.

25. The manufacturing method of the semiconductor device, according to claim 24, wherein a maximum process temperature at the time after the formation of at least the one of the gate electrode, the U-shaped source electrode, or the drain electrode is 450° C. or lower.

26. The manufacturing method of the semiconductor device, according to claim 21, wherein at least one of the gate electrode, the U-shaped source electrode, and the drain electrode comprises a material comprising aluminum.

27. The manufacturing method of the semiconductor device, according to claim 26, wherein a maximum process temperature at the time after the formation of at least the one of the gate electrode, the U-shaped source electrode, and the drain electrode is 380° C. or lower.

28. The manufacturing method of the semiconductor device, according to claim 21, wherein the gate electrode is formed through a photolithography process.

29. The manufacturing method of the semiconductor device, according to claim 21, wherein the U-shaped source electrode and the drain electrode are formed through a photolithography process.

30. The manufacturing method of the semiconductor device, according to claim 21, wherein the semiconductor device is an active matrix liquid crystal display device.

31. The manufacturing method of the semiconductor device, according to claim 21, wherein the semiconductor device is one selected from the group consisting of a memory device, an imaging device, a display device, an electro-optical device, and an electronic device.

* * * * *

UNITED STATES PATENT AND TRADEMARK OFFICE
CERTIFICATE OF CORRECTION

PATENT NO. : 8,628,987 B2  
APPLICATION NO. : 13/216501  
DATED : January 14, 2014  
INVENTOR(S) : Shunpei Yamazaki Page 1 of 1

It is certified that error appears in the above-identified patent and that said Letters Patent is hereby corrected as shown below:

In the Specification

Column 3, line 39, replace "fainted" with --formed--;

Column 5, line 9, replace "teens" with --terms--;

Column 5, line 28, after "including" replace "in" with --*m*--;

Column 11, line 26, replace "foamed" with --formed--;

Column 15, line 57, replace "foamed" with --formed--;

Column 17, line 42, replace "faulting" with --formed--;

Column 28, line 42, replace "foamed" with --formed--.

Signed and Sealed this  
Twenty-fourth Day of June, 2014

Michelle K. Lee  
*Deputy Director of the United States Patent and Trademark Office*